US011346895B2

(12) United States Patent
Endo

(10) Patent No.: US 11,346,895 B2
(45) Date of Patent: May 31, 2022

(54) METHOD OF MANUFACTURING MAGNETIC SENSOR AND MAGNETIC SENSOR ASSEMBLY

(71) Applicant: SHOWA DENKO K.K., Tokyo (JP)

(72) Inventor: Daizo Endo, Ichihara (JP)

(73) Assignee: SHOWA DENKO K.K., Tokyo (JP)

( * ) Notice: Subject to any disclaimer, the term of this patent is extended or adjusted under 35 U.S.C. 154(b) by 25 days.

(21) Appl. No.: 16/645,639

(22) PCT Filed: Sep. 12, 2018

(86) PCT No.: PCT/JP2018/033810

§ 371 (c)(1),
(2) Date: Mar. 9, 2020

(87) PCT Pub. No.: WO2019/065244

PCT Pub. Date: Apr. 4, 2019

(65) Prior Publication Data

US 2020/0264243 A1 Aug. 20, 2020

(30) Foreign Application Priority Data

Sep. 29, 2017 (JP) ............................ JP2017-190448

(51) Int. Cl.
*H01F 41/32* (2006.01)
*C23C 14/35* (2006.01)
(Continued)

(52) U.S. Cl.
CPC .............. *G01R 33/02* (2013.01); *C23C 14/06* (2013.01); *C23C 14/35* (2013.01); *H01F 10/08* (2013.01); *H01F 41/32* (2013.01)

(58) Field of Classification Search
CPC .. G01R 33/02; G01R 33/0052; G01R 33/093; C23C 14/35; C23C 14/06; H01F 10/08; H01F 41/32
See application file for complete search history.

(56) References Cited

U.S. PATENT DOCUMENTS 5,181,020 A 1/1993 Furukawa et al.
5,889,403 A 3/1999 Kawase
(Continued)

FOREIGN PATENT DOCUMENTS

CN 1726601 A 1/2006
CN 1873435 A 12/2006
(Continued)

OTHER PUBLICATIONS

JP-2004333247-A Translation (Year: 2004).*
(Continued)

*Primary Examiner* — Jennifer Wecker
*Assistant Examiner* — Patrick S Ott
(74) *Attorney, Agent, or Firm* — Sughrue Mion, PLLC

(57) ABSTRACT

A method of manufacturing a magnetic sensor includes: a soft magnetic material layer deposition process depositing a soft magnetic material layer (101) constituting a sensitive part (21) sensing a magnetic field on a substrate (10) by magnetron sputtering; and a sensitive part formation process forming the sensitive part (21) sensing the magnetic field in a portion of the soft magnetic material layer (101) where uniaxial magnetic anisotropy is provided by a magnetic field used for magnetron sputtering of the soft magnetic material layer (101).

4 Claims, 12 Drawing Sheets

N
S
1
331
10
332

(51) Int. Cl.

| | |
|---|---|
| ***C23C 14/06*** | (2006.01) |
| ***G01R 33/02*** | (2006.01) |
| ***H01F 10/08*** | (2006.01) |

(56) References Cited

U.S. PATENT DOCUMENTS

| | | | |
|---|---|---|---|
| 6,069,475 | A | 5/2000 | Isomura et al. |
| 6,255,813 | B1 | 7/2001 | Isomura et al. |
| 6,351,119 | B1 | 2/2002 | Kawase |
| 6,361,662 | B1 * | 3/2002 | Chiba .............. H01L 21/28052 204/192.2 |
| 6,501,678 | B1 | 12/2002 | Lenssen et al. |
| 6,599,401 | B1 * | 7/2003 | Wang .................. C23C 14/351 204/192.2 |
| 6,700,760 | B1 * | 3/2004 | Mao ...................... B82Y 25/00 360/324.2 |
| 6,741,434 | B1 | 5/2004 | Sato et al. |
| 2004/0058196 | A1 | 3/2004 | Lambeth |
| 2004/0130323 | A1 | 7/2004 | Oohashi et al. |
| 2004/0231135 | A1 | 11/2004 | Oohashi et al. |
| 2004/0233588 | A1 | 11/2004 | Oohashi et al. |
| 2005/0212632 | A1 | 9/2005 | Oohashi et al. |
| 2006/0056114 | A1 | 3/2006 | Fukumoto et al. |
| 2007/0053113 | A1 | 3/2007 | Papworth Parkin |
| 2010/0045285 | A1 * | 2/2010 | Ohmori ............. G01R 33/1269 324/260 |
| 2015/0125622 | A1 * | 5/2015 | Shepard ............. H01J 37/3458 427/547 |
| 2017/0178781 | A1 | 6/2017 | O'Donnell et al. |
| 2019/0178953 | A1 | 6/2019 | O'Donnell et al. |
| 2020/0003851 | A1 | 1/2020 | O'Donnell et al. |

FOREIGN PATENT DOCUMENTS

| | | | | |
|---|---|---|---|---|
| CN | 101429646 | A | | 5/2009 |
| CN | 102534523 | A | | 7/2012 |
| CN | 104465017 | A | | 3/2015 |
| EP | 0 448 114 | A1 | | 9/1991 |
| EP | 1 892 538 | A2 | | 2/2008 |
| EP | 2 110 867 | A1 | | 10/2009 |
| EP | 2 808 869 | A2 | | 12/2014 |
| JP | 08-330644 | A | | 12/1996 |
| JP | 10-90380 | A | | 4/1998 |
| JP | 10-116715 | A | | 5/1998 |
| JP | 10-195649 | A | | 7/1998 |
| JP | 2001-59859 | A | | 3/2001 |
| JP | 2001059859 | A | * | 3/2001 |
| JP | 2003-161770 | A | | 6/2003 |
| JP | 2004-333247 | A | | 11/2004 |
| JP | 2004333247 | A | * | 11/2004 |
| TW | 201724466 | A | | 7/2017 |

OTHER PUBLICATIONS

JP-2001059859-A Translation (Year: 2001).*

Extended European Search Report dated Jun. 2, 2021 in counterpart European Application No. 18861740.1.

International Search Report of PCT/JP2018/033810 dated Dec. 11, 2018 [PCT/ISA/210].

Jinqiang et al. "Giant Magneto-impedance Effect in Amorphous FeSiB Films", Vacuum Science and Machine Technology (China), vol. 20, Issue 4, Jul. 2000, pp. 243-246, (13 pages).

* cited by examiner

FIG.2A
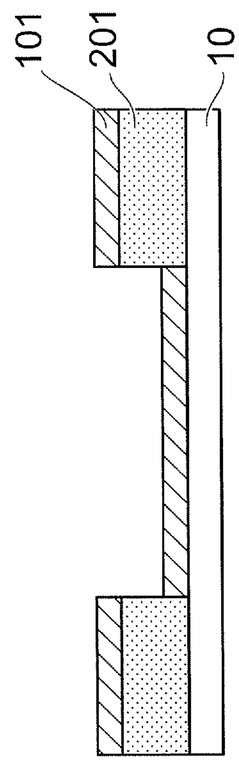
FIG.2B
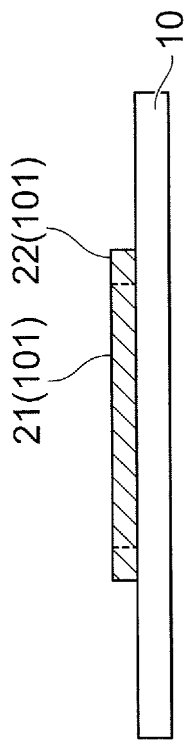
FIG.2C 1
332
10
331
N
S 322
331
330
332
N
S 1
331
10
332
C
S
N 331
330
332
322
C
S
N
β
α
γ

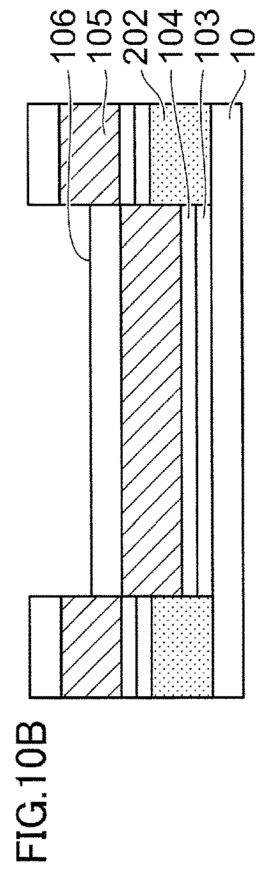
FIG.10A
FIG.10B
106
105
104
103
10
FIG.10C
203
106
105
104
103
10
FIG.10D
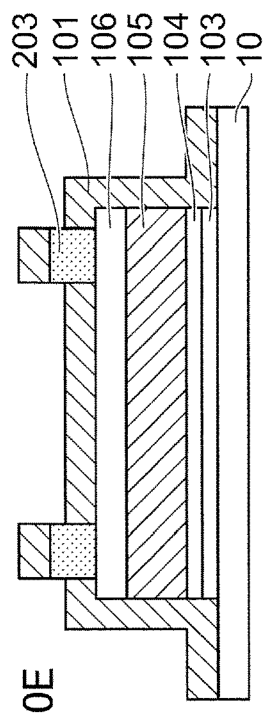
FIG.10E
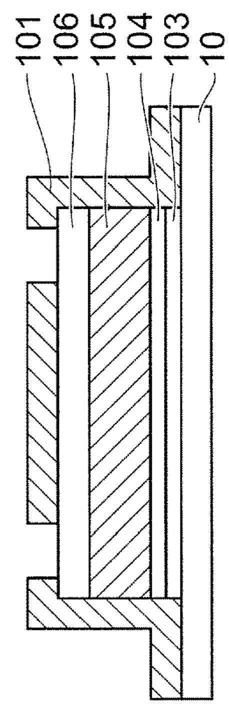
FIG.10F
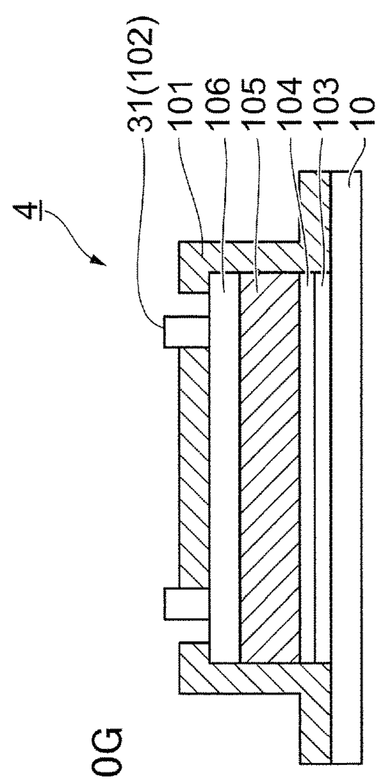
FIG.10G

METHOD OF MANUFACTURING MAGNETIC SENSOR AND MAGNETIC SENSOR ASSEMBLY

CROSS REFERENCE TO RELATED APPLICATIONS

This application is a National Stage of International Application No. PCT/JP2018/033810, filed Sep. 12, 2018, claiming priority to Japanese Patent Application No. 2017-190448, filed Sep. 29, 2017.

Technical Field

The present invention relates to a method of manufacturing a magnetic sensor and a magnetic sensor assembly.

Background Art

As a conventional art described in a gazette, there is a magnetic detecting element utilizing a magnetic impedance effect, in which: the magnetic detecting element is constituted by forming a high-permeability magnetic film on a non-magnetic substrate; the high-permeability magnetic film is formed to have a zigzag pattern having plural straight portions along a magnetic field detection direction which are arranged in parallel at predetermined intervals and interconnected to be sequentially folded and to be electrically connected in series with each other, and has magnetic anisotropy such that an easy direction of magnetization is perpendicular to the magnetic field detection direction in a plane of the high-permeability magnetic film; a high-frequency current is applied from both end portions of the high-permeability magnetic film; and a change in impedance generated by an external magnetic field between both the end portions of the high-permeability magnetic film is converted into an electric signal to obtain an output (refer to Patent Document 1).

CITATION LIST

Patent Literature

Patent Document 1: Japanese Patent Application Laid-Open Publication No. 8-330644

SUMMARY OF INVENTION

Technical Problem

By the way, the magnetic sensor adopting the magnetic impedance effect uses a reed-shaped soft magnetic material provided with uniaxial anisotropy in the shorter side as a sensitive part. The uniaxial anisotropy of the soft magnetic material has been provided by a magnetic field annealing treatment or the like after the sensitive part has been formed.

The present invention provides a manufacturing method of a magnetic sensor simplifying processes required for manufacturing as compared to a case using the magnetic field annealing treatment.

Solution to Problem

A method of manufacturing a magnetic sensor to which the present invention is applied includes: a soft magnetic material layer deposition process depositing a soft magnetic material layer on a substrate by magnetron sputtering, the soft magnetic material layer constituting a sensitive part sensing a magnetic field; and a sensitive part formation process forming the sensitive part sensing the magnetic field in a portion of the soft magnetic material layer where uniaxial magnetic anisotropy is provided by a magnetic field used for the magnetron sputtering.

In the sensitive part formation process of such a method of manufacturing a magnetic sensor, the sensitive part having a longer side and a shorter side is formed to be placed the shorter side direction in a direction of the uniaxial magnetic anisotropy.

Moreover, the magnetron sputtering is performed in a plane facing a surface of the substrate by use of a cathode in which a magnet forming a magnetic field rotates.

Further, in such a method of manufacturing a magnetic sensor, the soft magnetic material layer deposition process and the sensitive part formation process are performed on a substrate provided with a thin film magnet configured with a hard magnetic material forming a magnetic field in a direction intersecting the direction of the uniaxial magnetic anisotropy of the sensitive part.

From another standpoint, a magnetic sensor assembly to which the present invention is applied includes plural magnetic sensors, each including a sensitive part sensing a magnetic field, the sensitive part being disposed in the magnetic sensor while reflecting a position of a magnetic field formed in magnetron sputtering used for forming a soft magnetic material layer constituting the sensitive part.

The sensitive part of each of the plural magnetic sensors in such a magnetic sensor assembly has a longer side and a shorter side, and the shorter side direction is placed in a direction of the magnetic field formed in the magnetron sputtering.

Further, each of the plural magnetic sensors includes a thin film magnet configured with a hard magnetic material forming a magnetic field in a direction intersecting a direction of uniaxial magnetic anisotropy of the sensitive part.

Advantageous Effects of Invention

According to the present invention, it is possible to provide a manufacturing method of a magnetic sensor simplifying processes required for manufacturing as compared to a case using the magnetic field annealing treatment.

BRIEF DESCRIPTION OF DRAWINGS

FIG. 1A is a plan view and FIG. 1B is a cross-sectional view along the IB-IB line in FIG. 1A;

FIGS. 2A to 2C show diagrams illustrating an example of a method of manufacturing the magnetic sensor, where FIGS. 2A to 2C show respective processes in the method of manufacturing the magnetic sensor;

FIG. 4A shows the configuration of the magnetic circuit viewed from a target side and FIG. 4B shows arrangement of the magnetic sensors formed on the substrate (the magnetic sensor assembly);

FIG. 5A shows a configuration of the magnetic circuit in the modified example 1 viewed from a target side and FIG. 5B shows arrangement of the magnetic sensors formed on the substrate (the magnetic sensor assembly);

FIG. 6A shows a configuration of the magnetic circuit in the modified example 2 viewed from a target side and FIG. 6B shows arrangement of the magnetic sensors formed on the substrate (the magnetic sensor assembly);

FIG. 7A is a plan view and FIG. 7B is a cross-sectional view along the VIIB-VIIB line in FIG. 7A;

FIG. 8A is a plan view and FIG. 8B is a cross-sectional view along the VIIIB-VIIIB line in FIG. 8A;

FIG. 9A is a plan view and FIG. 9B is a cross-sectional view along the IXB-IXB line in FIG. 9A;

FIGS. 10A to 10G show diagrams illustrating an example of a manufacturing method of the magnetic sensor to which the fourth exemplary embodiment is applied, where FIGS. 10A to 10G show respective processes in the method of manufacturing the magnetic sensor;

FIG. 11A is a plan view and FIG. 11B is a cross-sectional view along the XIB-XIB line in FIG. 11A; FIG. 12A is a plan view and FIG. 12B is a cross-sectional view along the XIIB-XIIB line in FIG. 12A.

DESCRIPTION OF EMBODIMENTS

The magnetic sensor to be described in the present specification uses a so-called magnetic impedance effect element.

Hereinafter, exemplary embodiments according to the present invention will be described in detail with reference to attached drawings.

First Exemplary Embodiment

Configuration of Magnetic Sensor 1

First, a configuration of a magnetic sensor 1 to which the first exemplary embodiment is applied will be described.

Figure 1A:
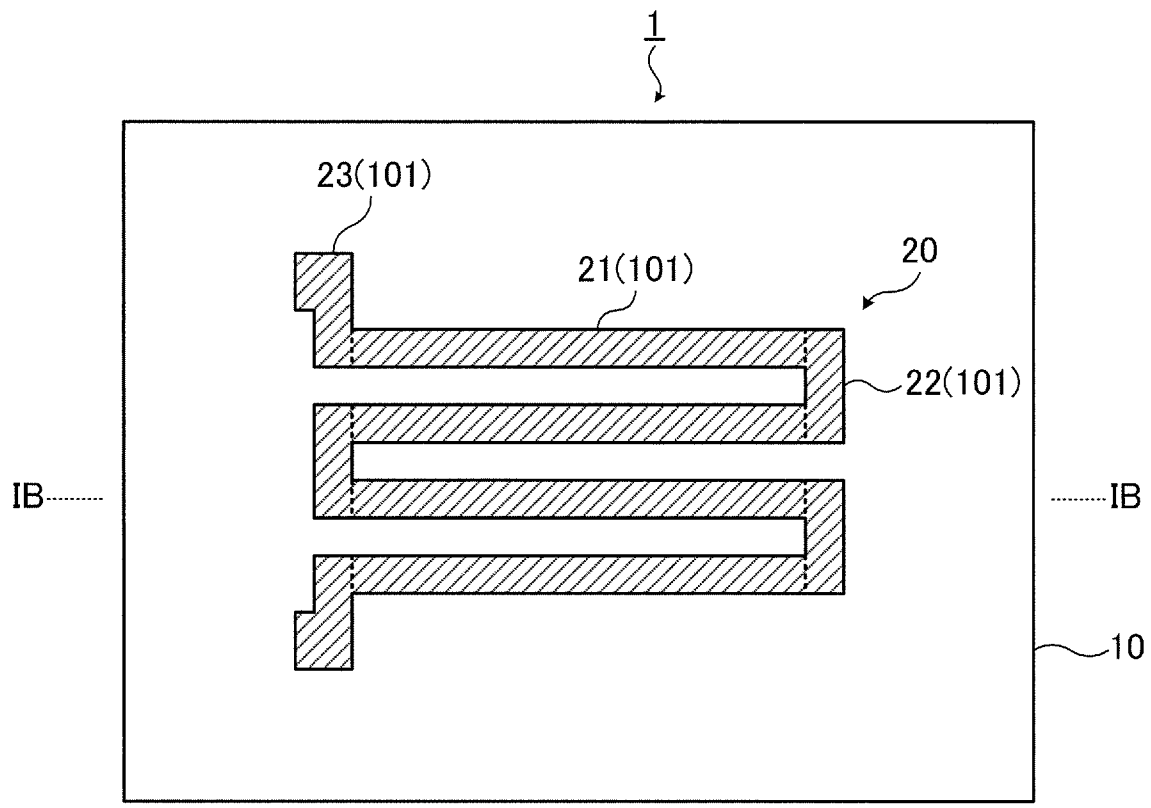
FIGS. 1A and 1B show diagrams illustrating an example of a magnetic sensor to which a first exemplary embodiment is applied, where
Figure 1B:
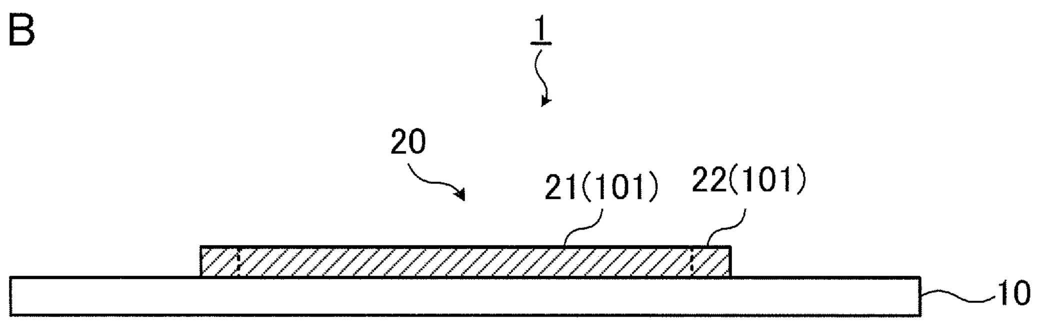

FIGS. 1A and 1B show diagrams illustrating an example of the magnetic sensor 1 to which the first exemplary embodiment is applied. FIG. 1A is a plan view and FIG. 1B is a cross-sectional view along the IB-IB line in FIG. 1A.

As shown in FIGS. 1A and 1B, the magnetic sensor 1 includes: a substrate 10; and a magnetic sensor main body 20 provided on the substrate 10 and configured with a soft magnetic material (a soft magnetic material layer 101 to be described later).

As shown in FIG. 1A, the magnetic sensor main body 20 includes: plural sensitive parts 21 sensing changes in a magnetic field (an external magnetic field); connection parts 22 connecting the plural sensitive parts 21 in serial (windingly) connection; and terminal parts 23 to which electric wires supplying electrical current to the sensitive parts 21 are connected. Note that, in the present specification, the soft magnetic material layer 101 constituting the sensitive part 21 is noted in brackets. The same is true in other cases.

Here, the soft magnetic material has a small, so-called coercive force, the soft magnetic material being easily magnetized by an external magnetic field but, upon removal of the external magnetic field, quickly returning to an original state with no magnetization or a little magnetization. As the soft magnetic material, an amorphous alloy, which is an alloy containing Co as a main component (hereinafter, referred to as a Co alloy constituting the sensitive part 21) doped with a high melting point metal, such as Nb, Ta or W. Examples of the Co alloy constituting the sensitive part 21 include CoNbZr, CoFeTa and CoWZr. Note that, in the present specification, composition ratios of alloys are not particularly shown. The same applies hereinafter.

The substrate 10 is composed of a non-magnetic material; for example, an oxide substrate, such as glass or sapphire, or a semiconductor substrate, such as silicon, can be used. Here, description will be given assuming that the substrate 10 is made of glass. Note that, as an example, the substrate 10 is in a disk shape having the diameter of about 95 mm and a thickness of about 0.5 mm. Plural magnetic sensors 1 are collectively manufactured on the substrate 10, and thereafter, divided (cut) into individual magnetic sensors 1. FIGS. 1A and 1B show a cut-out single magnetic sensor 1.

Note that, in the case where the substrate 10 is a conductor, an electrical insulating layer may be provided on the substrate 10.

Next, the magnetic sensor main body 20 will be described.

The sensitive part 21 is a reed-shaped member configured with the soft magnetic material layer 101 to be described later and provided so that the electrical current flows in the longer side. Then, the plural sensitive parts 21 (here, four) are arranged (disposed) with the longer side thereof being in parallel with one another. Note that the number of the sensitive parts 21 may be one.

The connection part 22 is configured with the soft magnetic material layer 101 and provided between end portions of the adjacent sensitive parts 21. Then, the connection parts 22 connect the plural sensitive parts 21 in series (windingly). Here, because of four sensitive parts 21, there are three connection parts 22. In the case of two sensitive parts 21, there may be one connection part 22. Note that, in the case of one sensitive part 21, it is unnecessary to provide the connection part 22. The width of the connection part 22 may be the same as the sensitive part 21.

Further, the terminal part 23 is configured with the soft magnetic material layer 101 and provided to (two) end portions of the sensitive parts 21, the end portions not being connected to the connection parts 22. The terminal part 23 includes a drawn-out portion drawn out of the sensitive part 21 and a portion (a pad) connecting electric wires for supplying the electrical current. Note that the portion connecting the electric wires may have a size capable of connecting the electric wires.

As shown FIGS. 1A and 1B, the sensitive parts 21, the connection parts 22 and the terminal parts 23 are formed by processing the same soft magnetic material layer 101 and are continued.

The magnetic sensor 1 is provided with uniaxial magnetic anisotropy in which an axis of easy magnetization faces the shorter side (the width direction) intersecting the longer side of the sensitive part 21.

When the magnetic sensor 1 is used, for example, a bias magnetic field generated by passing an electric current through a coil is applied so that a magnetic flux penetrates through in the longer side of the sensitive part 21 from the outside. Then, in the state where the bias magnetic field is applied, a high-frequency electric current is passed to the sensitive parts 21 from the two terminal parts 23 and a resistance value (impedance) between the terminal parts 23 is measured. The resistance value (impedance) between the terminal parts 23 senses a component of an external magnetic field in a direction along the longer side of the sensitive part 21. Consequently, by the measurement of the resistance value (impedance) between the terminal parts 23, the external magnetic field or changes in the external magnetic field are measured.

Note that the bias magnetic field is set in a state in which changes in the resistance value (impedance) between the terminal parts 23 are large with respect to the changes in the external magnetic field. In other words, application of the bias magnetic field to use the sharp changes in the impedance with respect to the external magnetic field makes it possible to grasp small changes in the external magnetic field.

The sensitive part 21 has, for example, the width in the shorter side of several tens of micrometers, the length in the longer side of about 1 mm and the thickness of 0.5 μm to 5 μm. The interval between two sensitive parts 21 disposed (arranged) in parallel is 50 μm to 100 μm. Accordingly, the planar shape of the magnetic sensor 1 is several millimeters square.

Note that other values may be used depending on the value of the external magnetic field to be measured or the soft magnetic material to be used.

Method of Manufacturing Magnetic Sensor 1

Next, a method of manufacturing the magnetic sensor 1 will be described. Plural magnetic sensors 1 are collectively manufactured. Here, description will be given while focusing on one magnetic sensor 1. In the manufacturing method to be described as follows, a lift-off method is used. Note that an etching method may also be used.

FIGS. 2A to 2C show diagrams illustrating an example of the method of manufacturing the magnetic sensor 1. FIGS. 2A to 2C show respective processes in the method of manufacturing the magnetic sensor 1. Note that FIGS. 2A to 2C show the representative processes, and the processes proceed in the order of FIGS. 2A to 2C. FIGS. 2A to 2C correspond to the cross-sectional view in FIG. 1B.

FIG. 2A shows a resist pattern formation process forming a resist pattern 201 for performing lift off of the soft magnetic material layer 101 to be deposited in the next FIG. 2B on the substrate 10.

Here, after washing the substrate 10, on one surface (hereinafter, referred to as a front surface) of the substrate 10, the resist pattern 201 is formed by a known photolithography, the resist pattern 201 having an opening portion in which the magnetic sensor main body 20 is formed.

Note that the resist pattern 201 is formed so that the sensitive parts 21 of the magnetic sensor main body 20 are disposed in a magnetic field used in a sputtering device 300 of a magnetron method (a magnetron sputtering device 300) to be described later and the shorter side (the width direction) of the sensitive part 21 faces the direction of the magnetic field.

Here, aligning the shorter side (the width direction) with the direction of the magnetic field refers to the angle between the direction of the magnetic field and the shorter side being less than 45°. Note that the smaller the angle between the direction of the magnetic field and the shorter side is, the better.

FIG. 2B shows a soft magnetic material layer deposition process depositing a layer of a soft magnetic material (a soft magnetic material layer 101) on the surface of the substrate 10 on which the resist pattern 201 has been formed.

Here, the soft magnetic material layer 101 is deposited on the substrate 10 by use of a target (a target to be shown in FIG. 3 to be described later) composed of the soft magnetic material by the magnetron sputtering device 300. Note that the soft magnetic material is the above-described Co alloy constituting the sensitive part 21.

Deposition of the soft magnetic material layer 101 or the like by the magnetron sputtering device 300 is referred to as deposition of the soft magnetic material layer 101 or the like by magnetron sputtering in some cases.

FIG. 2C shows a soft magnetic material layer lift-off process processing the soft magnetic material layer 101 deposited on the substrate 10 into the magnetic sensor main body 20 including the sensitive parts 21, the connection parts 22 and the terminal parts 23 by lift off.

Here, by removing the resist pattern 201, the soft magnetic material layer 101 deposited on the resist pattern 201 is also removed. Consequently, the soft magnetic material layer 101 is left in the opening portion of the resist pattern 201. In this manner, the magnetic sensor main body 20 is formed.

Note that the soft magnetic material layer lift-off process is an example of the sensitive part formation process. In the case where the etching method is used, a process of forming the sensitive parts 21 by etching serves as the sensitive part formation process.

Here, settings are made so that the sensitive parts 21 of the magnetic sensor main body 20 are disposed in the magnetic field of the magnetron sputtering device 300 and the shorter side (the width direction) of the sensitive part 21 faces the direction of the magnetic field of the magnetron sputtering device 300. Therefore, during the deposition, the soft magnetic material layer 101 is provided with uniaxial magnetic anisotropy in which the axis of easy magnetization faces the shorter side (the width direction) of the sensitive part 21. In other words, the uniaxial magnetic anisotropy is induced by the magnetic field of the magnetron sputtering device 300 to be provided. Consequently, the uniaxial magnetic anisotropy is referred to as induced magnetic anisotropy in some cases. This makes it unnecessary to perform magnetic field annealing treatment after the magnetic sensor 1 is formed.

Note that the magnetic field annealing treatment is heat treatment at 400° C. in a rotating magnetic field of, for example, 3 kG (0.3T) and by heat treatment at 400° C. in a static magnetic field of 3 kG (0.3 T) subsequent thereto.

In other words, in the method of manufacturing the magnetic sensor 1, to which the first exemplary embodiment is applied, the magnetic field annealing treatment at high temperature, such as 400° C., is not required.

Magnetron Sputtering Device 300

Here, description will be given of formation of the soft magnetic material layer 101 by use of the magnetron sputtering device 300 in FIG. 2B. First, the magnetron sputtering device 300 will be described.

Figure 3:
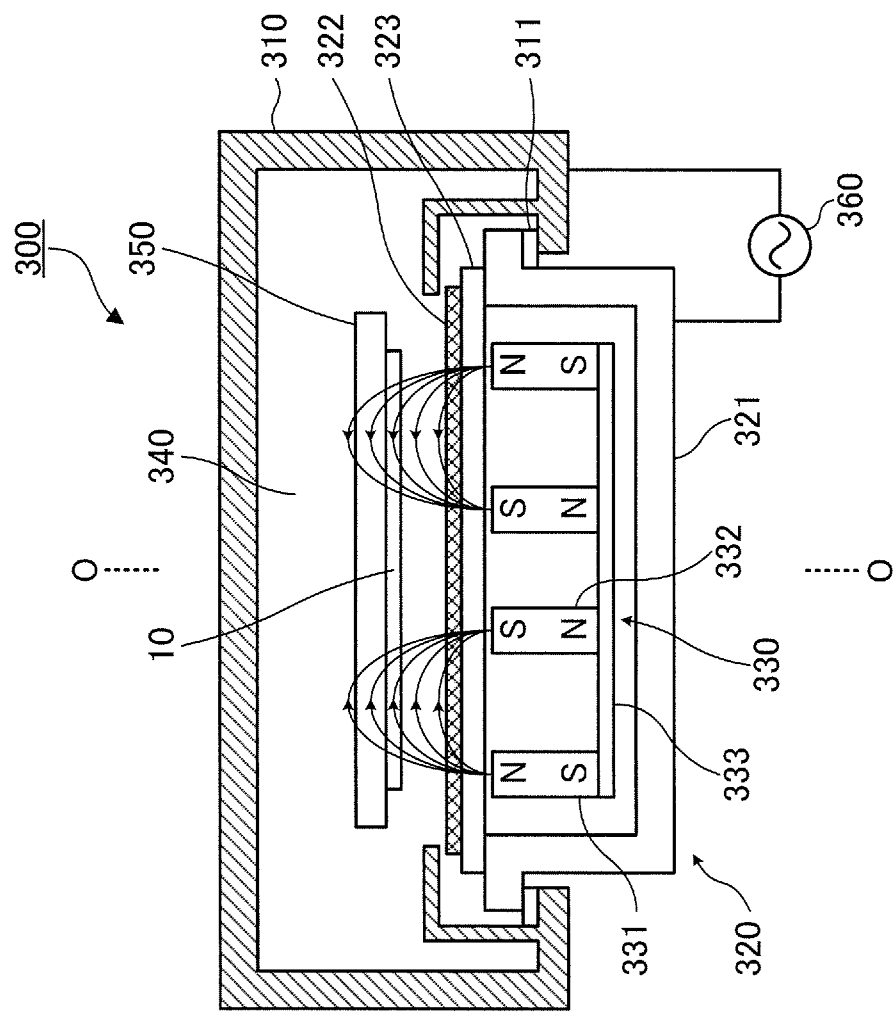
FIG. 3 is a cross-sectional view illustrating an overview of a magnetron sputtering device.

FIG. 3 is a cross-sectional view illustrating an overview of the magnetron sputtering device 300. The magnetron sputtering device 300 here is in a cylindrical shape with the O-O line in FIG. 3 as a rotational axis.

The magnetron sputtering device 300 includes a partition wall 310 and a magnetron cathode 320. The partition wall 310 and the magnetron cathode 320 constitute a chamber 340, which is sealed space, via an insulation member 311 made of polytetrafluoroethylene or the like.

The chamber 340 includes a substrate holder 350 for holding the substrate 10.

The partition wall 310 is grounded (GND). The substrate holder 350 is grounded (GND) via the partition wall 310 to function as an anode. In other words, a high-frequency power supply 360 is connected between the substrate holder 350 and the magnetron cathode 320 that have been grounded. Note that a DC power supply may be connected instead of the high-frequency power supply 360 to apply the direct current (DC) between the substrate holder 350 and the magnetron cathode 320.

Note that, though not shown in FIG. 3, the magnetron sputtering device 300 includes, other than the above, a vacuum pump reducing pressure in the chamber 340, a gas supply mechanism introducing gas used for sputtering, such as Ar, into the chamber 340, and a pressure adjustment mechanism keeping the pressure in the chamber 340 at a predetermined value. In addition, for cooling the magnetron cathode 320, a cooling mechanism supplying a cooling liquid to the magnetron cathode 320 may be provided. Then, a heating mechanism for heating the substrate 10, for example, an infrared lamp, or inversely, a cooling mechanism supplying a cooling liquid to the substrate holder 350 for cooling the substrate 10 may also be provided.

The magnetron cathode 320 includes: a cathode housing 321; a target 322 serving as a material of a thin film to be formed on the substrate 10; a backing plate 323 for holding the target 322; and a magnetic circuit 330 causing a magnetic field to pass through the backing plate 323 to be generated on the target 322 side.

The target 322 is composed of the above-described Co alloy constituting the sensitive part 21.

The backing plate 323 is configured with oxygen-free copper or the like having high conductivity. The target 322 is fastened to the surface of the backing plate 323 by a conductive adhesive agent or the like.

The cathode housing 321 is configured with a stainless steel or the like. The backing plate 323 to which the target 322 is attached is fastened to the cathode housing 321, and the magnetic circuit 330 is provided to the side of the backing plate 323 on which the target 322 has not been provided.

The size (diameter) of the target 322 is set so that a film can be formed (deposited) within a predetermined region (scope) of the substrate 10. Here, the diameter of the target 322 is set larger than the diameter of the substrate 10.

The magnetic circuit 330 includes: a magnet 331 on the backing plate 323 side of which a north pole is exposed; a magnet 332 on the backing plate 323 side of which a south pole is exposed; and a yoke 333 provided on a side of the magnets 331 and 332 opposite to the backing plate 323 side, the yoke 333 guiding a magnetic flux from the north pole of the magnet 332 to the south pole of the magnet 331. In general, a permanent magnet is used for the magnets 331 and 332.

Figure 4B:
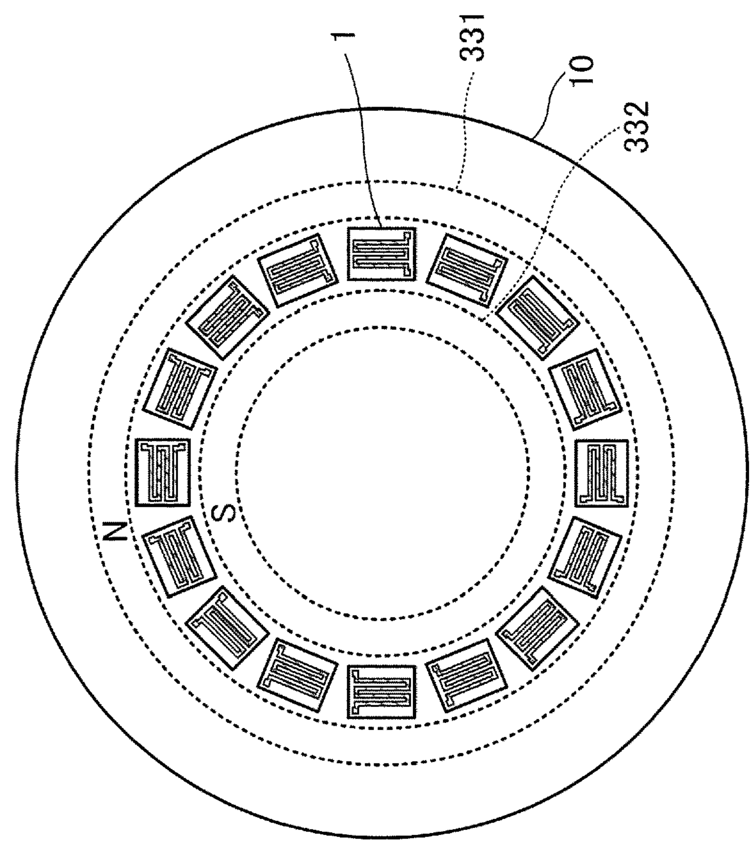
FIGS. 4A and 4B show diagrams showing a configuration of a magnetic circuit in the magnetron sputtering device and arrangement of magnetic sensors formed on a substrate (a magnetic sensor assembly), where
Figure 4A:
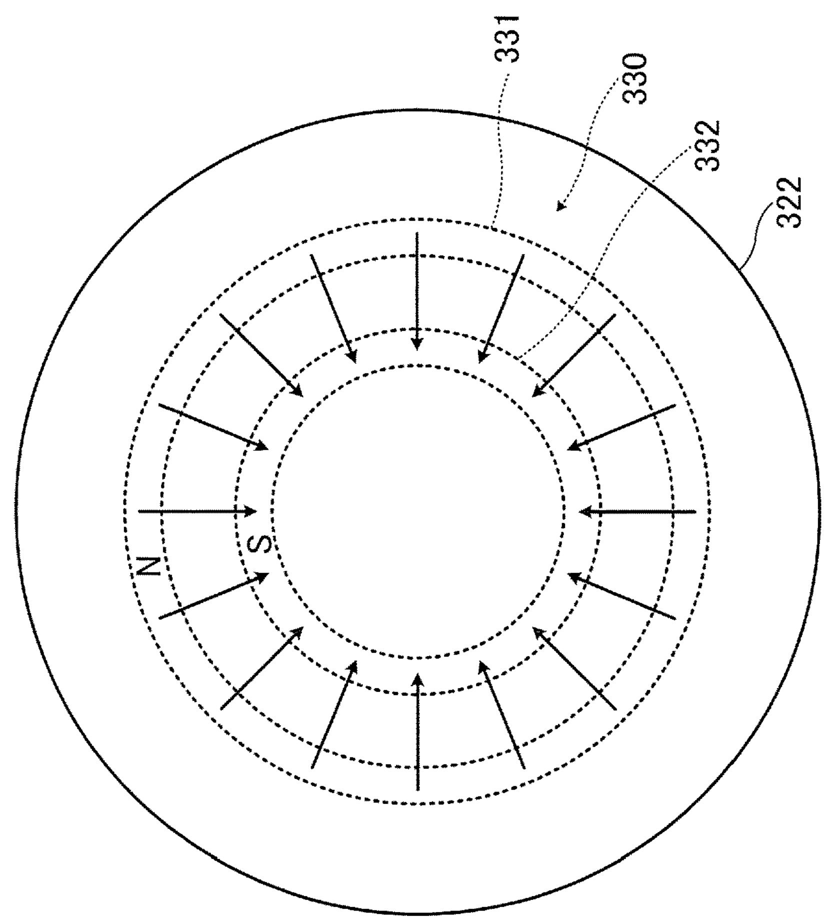

Here, as shown in FIGS. 4A and 4B to be described later, the magnets 331 and 332 are concentrically provided so that the magnet 331 on the backing plate 323 side of which the north pole is exposed is positioned at the outer side and the magnet 332 on the backing plate 323 side of which the south pole is exposed is positioned at the inner side.

Then, magnetic field lines (indicated by arrows) heading from the north pole of the magnet 331 to the south pole of the magnet 332 penetrate through the backing plate 323 and the target 322 to be generated in the chamber 340. A part of the magnetic field lines reaches the substrate 10 held by the substrate holder 350 and passes through the substrate 10 in the direction parallel to the front surface. That is, in a portion of the substrate 10 where the magnetic field lines passing through, a magnetic field in the direction parallel to the front surface is generated.

In other words, due to the magnetic field generated in the substrate 10 in the direction parallel to the front surface thereof, the uniaxial magnetic anisotropy is provided as the soft magnetic material layer 101 is deposited (formed) on the substrate 10.

Note that, in the magnetron sputtering device 300, electrons generated by discharge caused by the high-frequency power supply 360 are concentrated (confined) to the vicinity of the target 322 by the magnetic field lines on the front surface of the target 322. This increases collision probability of electrons and gases to accelerate ionization of gases, to thereby improve deposition rate of the film. Note that the front surface of the target 322 where the electrons are concentrated by the magnetic field lines becomes a scope to be eroded by impacts of ions of the ionized gases.

The substrate holder 350 is configured with a stainless steel or the like. The substrate holder 350 holds the substrate 10 by a mechanism (not shown) holding the substrate 10.

As described above, the magnetron sputtering device 300 has a cylindrical shape. The target 322 is also circular (in a disk shape). The substrate 10 is also circular (in a disk shape) and is held by the substrate holder 350 to face the target 322 (refer to FIGS. 4A and 4B to be described later).

As described above, the magnetron sputtering device 300 shown in FIG. 3 is a so-called sheet-fed type sputtering device forming (depositing) a film on each of the substrates 10.

In addition, the magnetron sputtering device 300 shown in FIG. 3 was configured so that the surface of the substrate 10 (the surface of the target 322) was horizontally (in left and right directions in the page of FIG. 3) disposed; however, the device may be configured so that the surface of the substrate 10 is vertically (in up and down directions in the page of FIG. 3) disposed.

FIGS. 4A and 4B show diagrams showing a configuration of a magnetic circuit 330 in the magnetron sputtering device 300 and arrangement of magnetic sensors 1 formed on the substrate 10 (a magnetic sensor assembly). FIG. 4A shows the configuration of the magnetic circuit 330 viewed from the target 322 side and FIG. 4B shows arrangement of the magnetic sensors 1 formed on the substrate 10 (the magnetic sensor assembly).

As shown in FIG. 4A, the target 322 is in a circular shape. The magnetic circuit 330 viewed through the target 322 is concentrically provided with the north pole of the magnet 331 and the south pole of the magnet 332. Then, thought the target 322, the magnetic field lines (arrows) heading from the north pole of the magnet 331 toward the south pole of the magnet 332 are formed.

Then, as shown in FIG. 4B, the substrate 10 is in a disc shape provided to face the target 322. Note that, in FIG. 4B, positions of the magnets 331 and 332 of the facing magnetic circuit 330 are aligned. The magnetic sensors 1 are arranged (disposed) so that, in the portion of the substrate 10 where the magnetic field lines pass through (the magnetic field), the shorter side (the width direction) of the sensitive part 21 formed of the soft magnetic material layer 101 faces the direction in which the magnetic field lines pass through. For example, the magnetic sensors 1 are arranged (disposed) so that, between the circle formed by the north pole of the magnet 331 and the circle formed by the south pole of the magnet 332, the shorter side (the width direction) of the sensitive part 21 is aligned with the diameter direction of the circles.

Here, one magnetic sensor 1 is shown between the circle formed by the north pole of the magnet 331 and the circle formed by the south pole of the magnet 332 in the magnetic circuit 330. This is to describe a relationship between the sensitive part 21 of the magnetic sensor 1 and the magnetic field generated by the north pole of the magnet 331 and the south pole of the magnet 332. The magnetic sensor 1 is disposed so that the shorter side of the sensitive part 21 in the magnetic sensor main body 20 is in line with the direction of the magnetic field. Then, plural magnetic sensors 1 are disposed along the circumferential direction.

Note that, as described above, the planar shape of the magnetic sensor 1 is several millimeters square. Consequently, in actuality, the plural magnetic sensors 1 are disposed in the direction of the magnetic field formed by the north pole of the magnet 331 and the south pole of the magnet 332. Moreover, this holds true in the circumferential direction.

Note that the central portion or the outer circumferential portion of the substrate 10 is less affected by the magnetic field caused by the magnetic circuit 330. In other words, the uniaxial magnetic anisotropy is less likely to be provided to the soft magnetic material layer 101 by the magnetic field caused by the magnetic circuit 330. The region on the substrate 10 where the magnetic sensors 1 are to be provided may be a region where predetermined uniaxial magnetic anisotropy is provided. Note that the magnetic field is strong between the north pole of the magnet 331 and the south pole of the magnet 332. It is therefore preferable to dispose the magnetic sensors 1 between the north pole of the magnet 331 and the south pole of the magnet 332. Note that, if the predetermined uniaxial magnetic anisotropy is provided, the region where the magnetic sensors 1 are to be provided may not be the region between the north pole of the magnet 331 and the south pole of the magnet 332. Consequently, it is preferable not to dispose the magnetic sensors 1 at the center portion or the outer circumferential portion of the substrate 10 where the uniaxial magnetic anisotropy is hard to be provided. However, in the case where the magnetic sensors 1 have been disposed at the center portion or the outer circumferential portion of the substrate 10, the uniaxial magnetic anisotropy may be provided to the magnetic sensors 1 disposed at the center portion or the outer circumferential portion of the substrate 10 by the magnetic field annealing treatment or the like.

Then, the state in which the plural magnetic sensors 1 are formed on the substrate 10 is referred to as a magnetic sensor assembly. In some cases, the substrate 10 is shipped just as the state in which the plural magnetic sensors 1 are formed thereon. In other words, the substrate 10 is to be divided (cut) to generate individual magnetic sensors 1 at the shipment's destination. Note that the substrate 10 may be a part thereof.

In FIG. 4B, the magnetic sensor assembly in which the individual magnetic sensors 1 have not been cut from the substrate 10 is shown. However, the magnetic sensor assembly may be in a state in which the substrate 10 is bonded to an adhesive sheet and cut for the respective magnetic sensors 1 by a cutting means, such as a laser, and thereafter, the adhesive sheet is enlarged to make it easy to take out the magnetic sensors 1. It is also possible to ship the magnetic sensors 1 in such a state. In other words, the individual magnetic sensors 1 are taken out of an adhesive tape at the shipment's destination. Note that the substrate 10 may be a part thereof.

In any magnetic sensor assembly, the magnetic sensors 1 are disposed in a state reflecting the disposition of the magnets 331 and 332 of the magnetic circuit 330 in the magnetron cathode 320 of the magnetron sputtering device 300 forming the soft magnetic material layer 101.

As described above, in the first exemplary embodiment, by use of the magnetron sputtering device 300 for forming (depositing) the soft magnetic material layer 101, the uniaxial magnetic anisotropy is provided at the same time of deposition of the soft magnetic material layer 101, as well as the deposition rate of the soft magnetic material layer 101 is improved to reduce the time required for deposition. Therefore, in manufacturing of the magnetic sensors 1, the need for the process of magnetic field annealing treatment for providing the uniaxial magnetic anisotropy is eliminated, and thereby the processes required for manufacturing are simplified.

Modified Example 1

Next, a modified example 1 of the magnetic circuit 330 in the magnetron sputtering device 300 will be described.

Figure 5B:
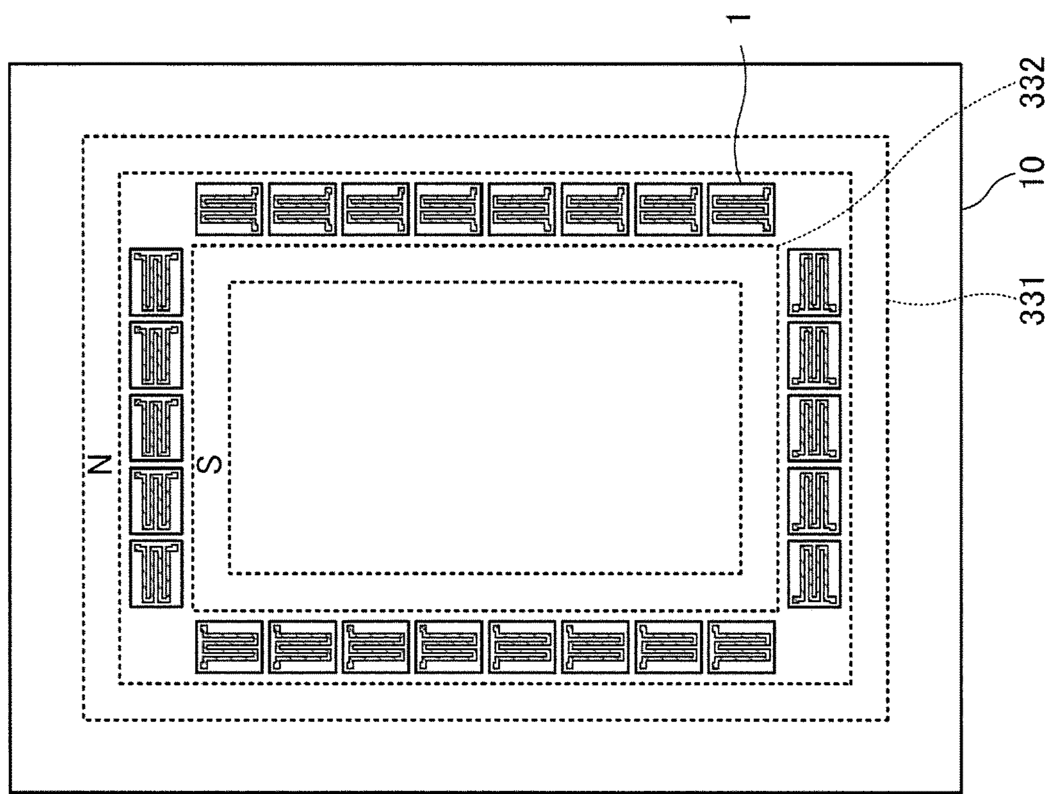
FIGS. 5A and 5B show diagrams showing a modified example 1 of the magnetic circuit in the magnetron sputtering device and arrangement of magnetic sensors formed on a substrate (a magnetic sensor assembly), where
Figure 5A:
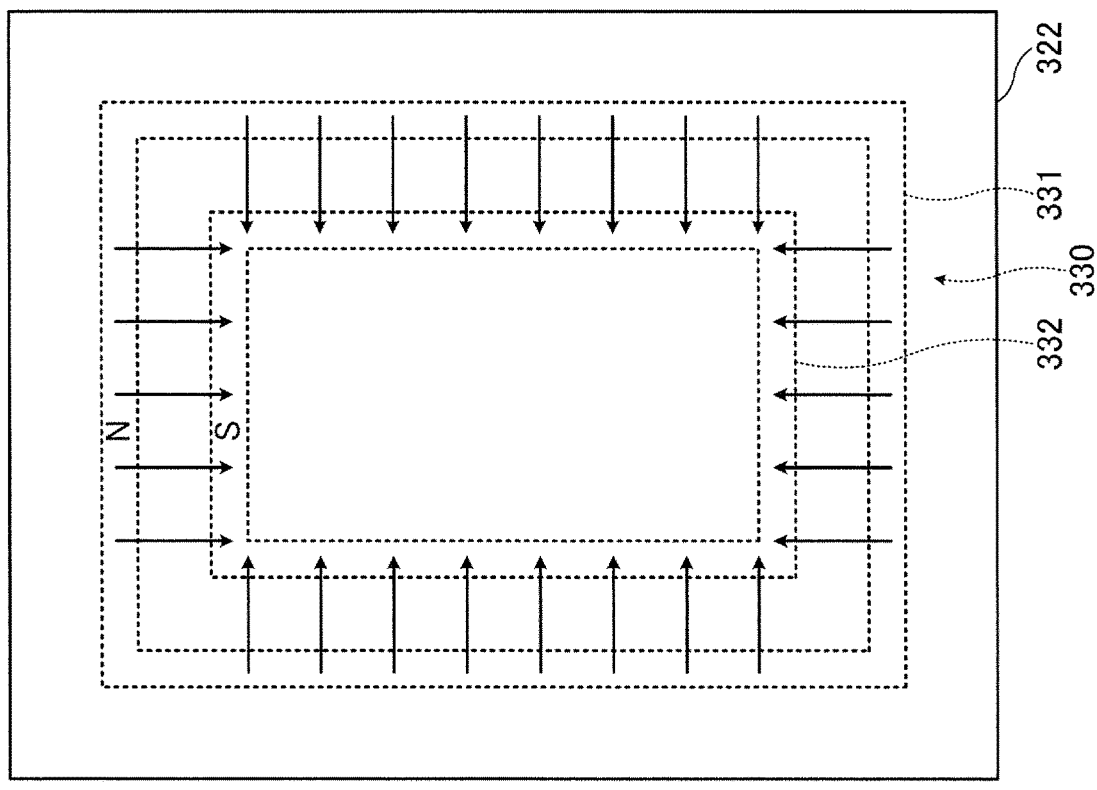

FIGS. 5A and 5B show diagrams showing the modified example 1 of the magnetic circuit 330 in the magnetron sputtering device 300 and arrangement of magnetic sensors 1 formed on the substrate 10 (the magnetic sensor assembly). FIG. 5A shows the configuration of the magnetic circuit 330 of the modified example 1 viewed from the target 322 side and FIG. 5B shows arrangement of the magnetic sensors 1 formed on the substrate 10 (the magnetic sensor assembly).

As shown in FIG. 5A, a planar shape of the target 322 in the magnetic circuit 330 of the modified example 1 is a rectangle. In other words, in the magnetron sputtering device 300 including the magnetic circuit 330 of the modified example 1, the chamber 340 is in a prismatic shape, not in the cylindrical shape. Note that the other configurations are the same as the magnetron sputtering device 300 shown in FIG. 3. Therefore, descriptions of the similar portions will be omitted.

In the magnetic circuit 330 of the modified example 1 viewed through the target 322, inside the rectangular target 322, the north pole of the magnet 331 is provided along the sides of the rectangle, and inside thereof, the south pole of the magnet 332 is disposed (aligned) along the sides of the rectangle.

Here, as shown in FIG. 5B, the substrate 10 is in a rectangular shape provided to face the target 322. Note that, in FIG. 5B, positions of the magnets 331 and 332 of the facing magnetic circuit 330 are aligned. The magnetic sensors 1 are arranged so that, in the portion of the substrate 10 where the magnetic field lines pass through, the shorter side (the width direction) of the sensitive part 21 formed of the soft magnetic material layer 101 faces the direction in which the magnetic field lines pass through (the direction of the magnetic field). In other words, the magnetic sensors 1 are provided so that, inside the magnetic field formed by the north pole of the magnet 331 and the south pole of the magnet 332, the shorter side (the width direction) of the sensitive part 21 is aligned with the direction of the magnetic field.

Here, one magnetic sensor 1 is also shown between the north pole of the magnet 331 and the south pole of the magnet 332 in the magnetic circuit 330. This is to describe a relationship between the sensitive part 21 of the magnetic sensor 1 and the magnetic field generated by the north pole of the magnet 331 and the south pole of the magnet 332. The magnetic sensor 1 is disposed along the sides of the rectangle where the magnets 331 and 332 are provided so that the shorter side of the sensitive part 21 in the magnetic sensor main body 20 is in line with the direction of the magnetic field.

Note that, as described above, the planar shape of the magnetic sensor 1 is several millimeters square. Consequently, the plural magnetic sensors 1 are disposed between the north pole of the magnet 331 and the south pole of the magnet 332. In addition, this holds true for the directions along the sides of the rectangle where the magnets 331 and 332 are provided.

In FIG. 5B, the magnetic sensor assembly in which the individual magnetic sensors 1 have not been cut from the substrate 10 is shown. However, the magnetic sensor assembly may be in a state in which the substrate 10 is bonded to an adhesive sheet and cut for the respective magnetic sensors 1 by a cutting means, such as a laser, and thereafter, the adhesive sheet is enlarged to make it easy to take out the magnetic sensors 1. It is also possible to ship the magnetic sensors 1 in such a state. In other words, the individual magnetic sensors 1 are taken out of an adhesive tape at the shipment's destination. Note that the substrate 10 may be a part thereof.

In any magnetic sensor assembly, the magnetic sensors 1 are disposed in a state reflecting the disposition of the magnets 331 and 332 of the magnetic circuit 330 in the magnetron cathode 320 of the magnetron sputtering device 300 forming the soft magnetic material layer 101.

Note that, as shown in FIG. 5B, the substrate 10 was made into a rectangle to correspond to the planar shape of the target 322. However, the substrate 10 may be in a circular shape as shown in FIG. 4B. It may be sufficient that the plural magnetic sensors 1 are disposed to correspond to the magnetic field generated by the north pole of the magnet 331 and the south pole of the magnet 332 of the magnetic circuit 330.

Note that, in FIG. 5A, it was assumed that the magnets 331 and 332 constituting the magnetic circuit 330 of the modified example 1 were rectangles; however, the magnets may be in a square shape or in a polygonal shape. Then, it may be sufficient that the shorter side of the sensitive part 21 of the magnetic sensor 1 to be manufactured is disposed in the direction of the magnetic field generated by the magnets 331 and 332.

Modified Example 2

Next, a modified example 2 of the magnetic circuit 330 in the magnetron sputtering device 300 will be described.

Figure 6B:
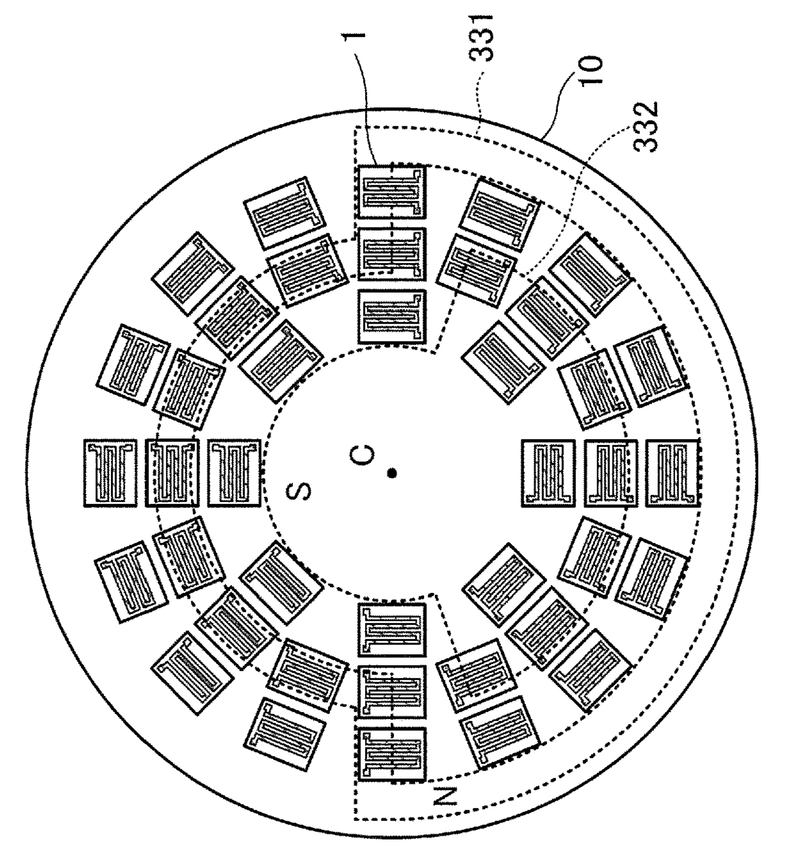
FIGS. 6A and 6B show diagrams showing a modified example 2 of the magnetic circuit in the magnetron sputtering device and arrangement of magnetic sensors formed on a substrate (a magnetic sensor assembly), where
Figure 6A:
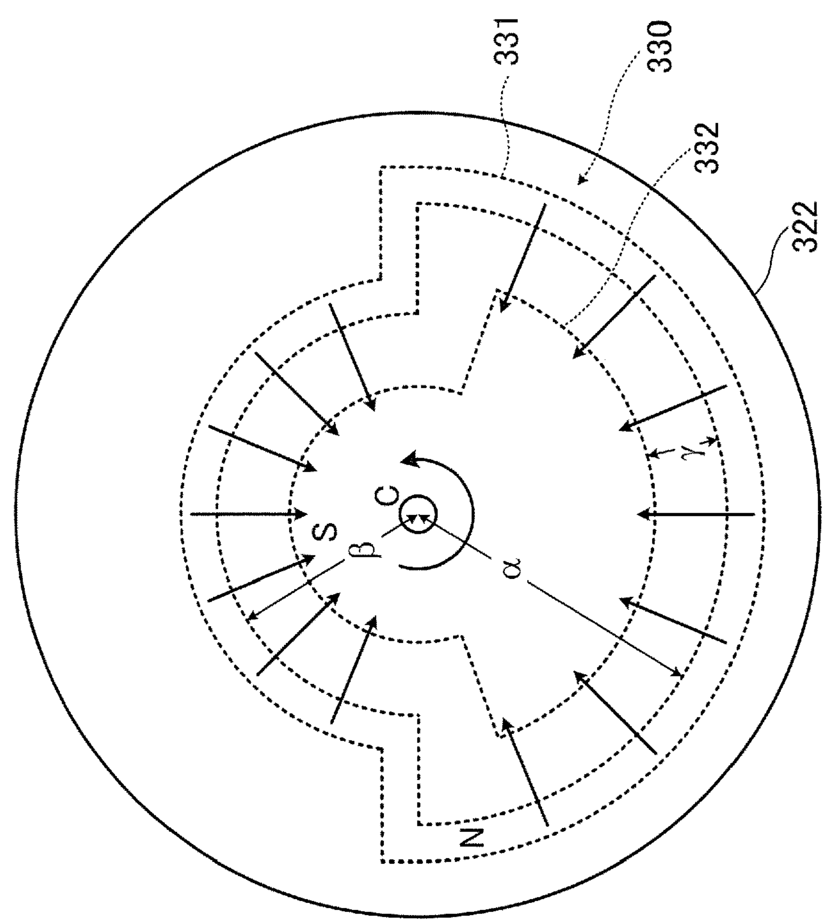

FIGS. 6A and 6B show diagrams showing a configuration of the modified example 2 of the magnetic circuit 330 in the magnetron sputtering device 300 and arrangement of magnetic sensors 1 formed on the substrate 10 (the magnetic sensor assembly). FIG. 6A shows the configuration of the magnetic circuit 330 of the modified example 2 viewed from the target 322 side and FIG. 6B shows arrangement of the magnetic sensors 1 formed on the substrate 10 (the magnetic sensor assembly).

As shown in FIG. 6A, in the magnetic circuit 330 of the modified example 2, similar to the magnetic circuit 330 shown in FIGS. 4A and 4B, the target 322 is in a disk shape and the magnet 331 is provided to enclose the magnet 332. However, the magnet 331 is configured to include a portion with a distance $\alpha$ from the center C of the target 322 to an end thereof and a portion with a distance $\beta$ that is shorter than the distance $\alpha$ ($\alpha>\beta$). Then, a distance $\gamma$ between the magnet 331 and the magnet 332 is provided roughly the same.

Note that the other configurations of the magnetron sputtering device 300 including the magnetic circuit 330 of the modified example 2 are the same as those of the magnetron sputtering device 300 shown in FIG. 3. Therefore, descriptions of the similar portions will be omitted.

The magnet 331 and the magnet 332 are configured to rotate around the center C of the target 322 as a rotation axis while keeping this states. Note that the magnetic circuit 330 provided with the magnets 331 and 332 rotates, whereas the target 322 (the backing plate 323) does not rotate. In other words, on a back surface of the target 322 (the backing plate 323), the magnetic circuit 330 rotates within a virtual plane (a plane including an end portion of the north pole of the magnet 331 and an end portion of the south pole of the magnet 332) in parallel with the surface of the target 322 (the backing plate 323). Here, since the target 322 and the substrate 10 are disposed in parallel with each other, the magnetic circuit 330 rotates in-plane in parallel with the surface of the substrate 10. Note that the magnetic circuit 330 is not necessarily needed to rotate in-plane in parallel with the substrate 10; the magnetic circuit 330 may rotate in-plane facing the surface of the substrate 10.

With this, on the target 322, a magnetic field caused in the portions of the distance $\alpha$ and the distance $\alpha$-$\gamma$ from the center C and a magnetic field caused in the portions of the distance $\beta$ and the distance $\beta$-$\gamma$ from the center C are alternately generated. This enlarges the region (area) where the electrons are added, as compared to the case shown in FIG. 4A. Consequently, the scope in which the target 322 is to be eroded by impacts of ions is expanded, and thereby the efficiency of use of the target 322 is increased.

Moreover, since an area on which the magnetic field is to be formed is enlarged also on the substrate 10, the area on which the uniaxial magnetic anisotropy is provided to the soft magnetic material layer 101 is enlarged. That is to say, the region capable of forming the magnetic sensors 1 is enlarged. Accordingly, as shown in FIG. 6B, the magnetic sensors 1 are arranged so that, in the portion of the magnetic circuit 330 where the magnetic field lines generated by the magnets 331 and 332 pass through, the shorter side (the width direction) of the sensitive part 21 formed of the soft magnetic material layer 101 faces the direction in which the magnetic field lines pass through (the direction of the magnetic field). For example, the magnetic sensors 1 are disposed inside the magnetic field formed by the magnets 331 and 332 in the magnetic circuit 330, that is, between a circle assuming the maximum distance from the center C to the north pole of the magnet 331 as a radius and a circle assuming the minimum distance from the center C to the south pole of the magnet 332 as a radius. In this manner, as compared to the case shown in FIG. 4B, the number of magnetic sensors 1 that can be manufactured on the substrate 10 is increased.

Note that, in FIG. 6B, positions of the magnets 331 and 332 of the facing magnetic circuit 330 are aligned.

Here, three magnetic sensors 1 are shown in the diameter direction between the circle assuming the maximum distance from the center C to the north pole of the magnet 331 as a radius and the circle assuming the minimum distance from the center C to the south pole of the magnet 332 as a radius. This is to describe a relationship between the sensitive part 21 of the magnetic sensor 1 and the magnetic field generated by the north pole of the magnet 331 and the south pole of the magnet 332. The magnetic sensors 1 are disposed along the circumference so that the shorter side of the sensitive part 21 in the magnetic sensor main body 20 is in line with the direction of the magnetic field.

Note that, as described above, the planar shape of the magnetic sensor 1 is several millimeters square. Consequently, the plural magnetic sensors 1 are disposed in the direction (the diameter direction) of the magnetic field formed by the north pole of the magnet 331 and the south pole of the magnet 332. Moreover, this holds true in the circumferential direction.

In FIG. 6B, the magnetic sensor assembly in which the individual magnetic sensors 1 have not been cut from the substrate 10 is shown. However, the magnetic sensor assembly may be in a state in which the substrate 10 is bonded to an adhesive sheet and cut for the respective magnetic sensors 1 by a cutting means, such as a laser, and thereafter, the adhesive sheet is enlarged to make it easy to take out the magnetic sensors 1. It is also possible to ship the magnetic sensors 1 in such a state. In other words, the individual magnetic sensors 1 are taken out of an adhesive tape at the shipment's destination. Note that the substrate 10 may be a part thereof.

In any magnetic sensor assembly, the individual magnetic sensors 1 are disposed in a state reflecting the disposition of the magnets 331 and 332 of the magnetic circuit 330 in the magnetron cathode 320 of the magnetron sputtering device 300 forming the soft magnetic material layer 101.

Note that the arrangement and shape of the magnets 331 and 332 constituting the magnetic circuit 330 may be the arrangement and shape other than those shown in FIGS. 6A and 6B. The arrangement and shape of the magnets 331 and 332 may be set to enlarge the area in which the uniaxial magnetic anisotropy of the soft magnetic material layer 101 formed on the substrate 10 can be obtained.

Second Exemplary Embodiment

In a magnetic sensor 2 to which a second exemplary embodiment is applied, the connection part 22 and the terminal part 23 are configured with a conductive material. Hereinafter, portions different from those of the first exemplary embodiment will be mainly described, and similar portions will be assigned with same reference signs to thereby omit descriptions thereof.

Magnetic Sensor 2

Figure 7A:
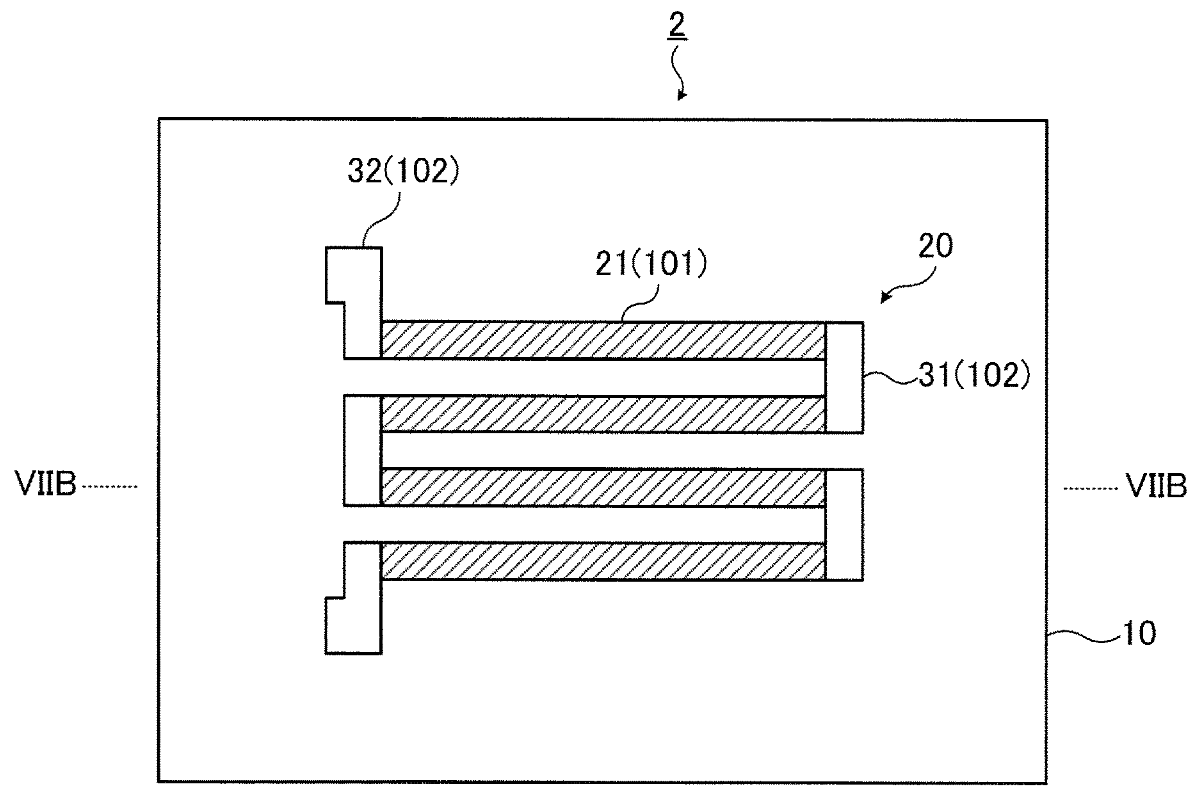
FIGS. 7A and 7B show diagrams illustrating an example of a magnetic sensor to which a second exemplary embodiment is applied, where
Figure 7B:
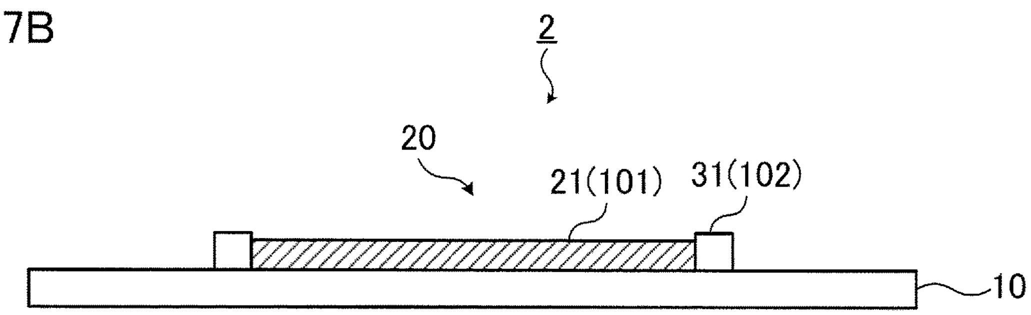

FIGS. 7A and 7B show diagrams illustrating an example of the magnetic sensor 2 to which the second exemplary embodiment is applied. FIG. 7A is a plan view and FIG. 7B is a cross-sectional view along the VIIB-VIIB line in FIG. 7A.

As shown in FIG. 7A, the magnetic sensor main body 20 includes: the plural sensitive parts 21; connection conductive parts 31 connecting the plural sensitive parts 21 in serial (winding) connection; and terminal conductive parts 32 to which electric wires supplying electrical current to the sensitive parts 21 are connected.

The connection conductive part 31 and the terminal conductive part 32 may be conductors with excellent conductivity, and, for example, Cu, Au or Al can be used.

Use of the connection conductive part 31 does not cause the magnetic impedance effect in the connection part 22 of the magnetic sensor main body 20 in the magnetic sensor 1 in FIGS. 1A and 1B, and thereby the magnetic field is detected only by the magnetic impedance effect of the sensitive part 21. With this, only the magnetic impedance effect in the direction of detecting the magnetic field is extracted, the detection sensitivity is improved.

Note that, by making the terminal conductive part 32 with the conductor, it becomes easy to connect the electric wire for supplying the electrical current to the sensitive part 21.

The connection conductive part 31 and the terminal conductive part 32 can be formed by, for example, the sputtering method or the vacuum deposition method by use of a metal mask. In other words, the connection conductive part 31 and the terminal conductive part 32 can be formed by, subsequent to FIG. 2C, depositing a conductor layer 102 through a metal mask in which regions of the connection conductive part 31 and the terminal conductive part 32 are opened.

In addition, the connection conductive part 31 and the terminal conductive part 32 may be formed by a lift-off method using a photoresist. In other words, the connection conductive part 31 and the terminal conductive part 32 can be formed by, subsequent to FIG. 2C, depositing the conductor layer 102 after a resist pattern in which the regions for forming the connection conductive part 31 and the terminal conductive part 32 are opened is formed, and then removing the resist pattern.

Note that, in any case, the connection conductive part 31 may be provided to overlap the connection part 22 of the soft magnetic material layer 101, or may be provided to be connected with the sensitive part 21 without the connection part 22. This holds true for the terminal conductive part 32.

In addition, in the case where the terminal conductive part 32 is desired to be thicker than the connection conductive part 31, the connection conductive part 31 and the terminal conductive part 32 can be formed in separate processes.

Third Exemplary Embodiment

In a magnetic sensor 3 to which a third exemplary embodiment is applied, the sensitive part 21 is configured with two soft magnetic material layers provided with a demagnetizing field suppressing layer interposed therebetween. Hereinafter, portions different from those of the first exemplary embodiment will be mainly described, and similar portions will be assigned with same reference signs to thereby omit descriptions thereof.

Magnetic Sensor 3

Figure 8A:
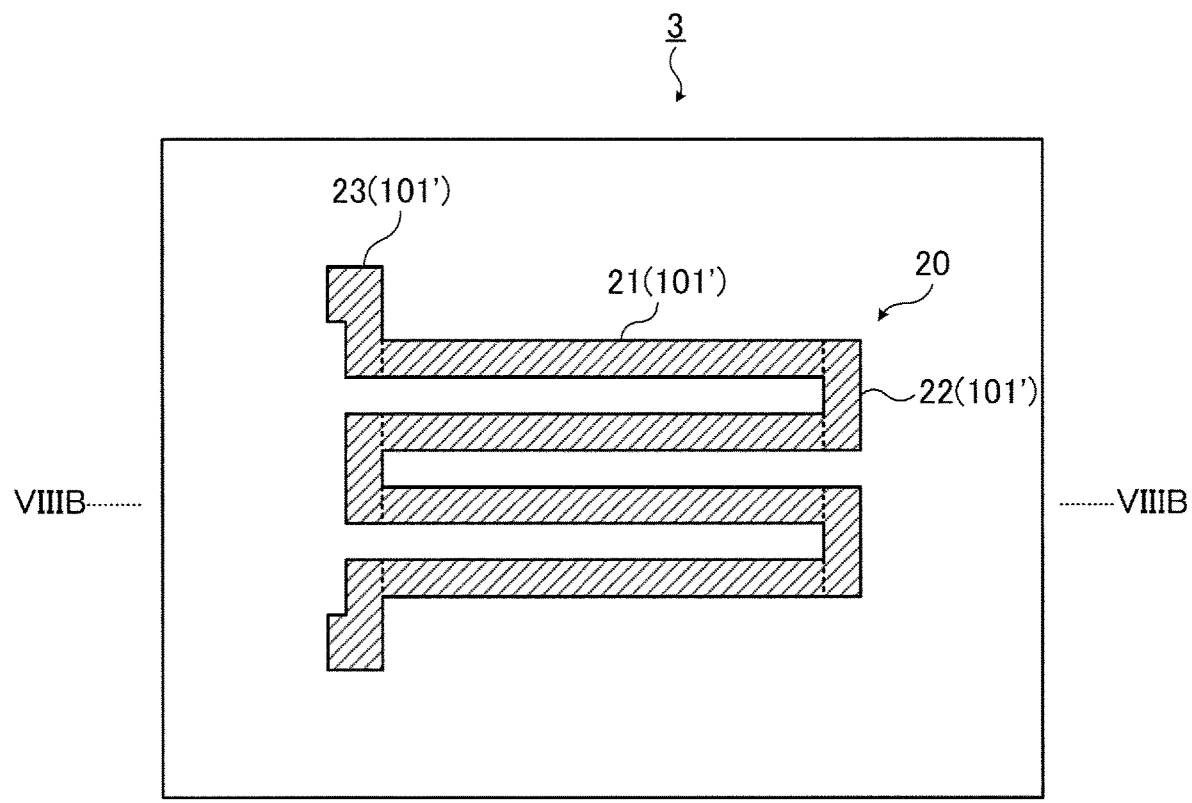
FIGS. 8A and 8B show diagrams illustrating an example of a magnetic sensor to which a third exemplary embodiment is applied, where
Figure 8B:
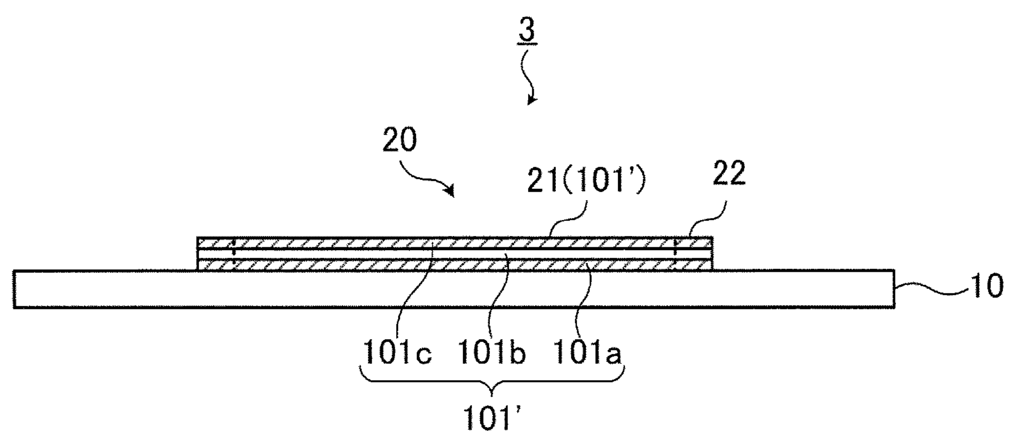

FIGS. 8A and 8B show diagrams illustrating an example of the magnetic sensor 3 to which the third exemplary embodiment is applied. FIG. 8A is a plan view and FIG. 8B is a cross-sectional view along the VIIIB-VIIIB line in FIG. 8A.

As shown in FIG. 8B, in the magnetic sensor 3, a magnetic material layer 101' includes a lower soft magnetic material layer 101*a* on a lower layer (the substrate 10) side, a demagnetizing field suppressing layer 101*b* and an upper soft magnetic material layer 101*c* on an upper layer (opposite to the substrate 10) side. In other words, the lower soft magnetic material layer 101*a* and the upper soft magnetic material layer 101*c* are provided with the demagnetizing field suppressing layer 101*b* interposed therebetween. For the lower soft magnetic material layer 101*a* and the upper soft magnetic material layer 101*c*, similar to the soft magnetic material in the first exemplary embodiment, an amorphous alloy made of an alloy containing Co as the main component (the Co alloy constituting the sensitive part 21) doped with a high melting point metal, such as Nb, Ta or W, can be used. Examples of the Co alloy constituting the sensitive part 21 include CoNbZr, CoFeTa and CoWZr.

For the demagnetizing field suppressing layer 101*b*, Ru or an Ru alloy can be used.

Here, the thickness of the demagnetizing field suppressing layer 101*b* made of Ru or the Ru alloy ranging from 0.4 nm to 1.0 nm or from 1.6 nm to 2.6 nm provides an AntiFerromagnetically-Coupled (AFC) structure to the lower soft magnetic material layer 101*a* and the upper soft magnetic material layer 101*c*. In other words, the demagnetizing field is suppressed, and thereby sensitivity of the sensitive part 21 is increased.

For the magnetic sensor 3, in the soft magnetic material layer deposition process shown in FIG. 2B, the lower soft magnetic material layer 101*a*, the demagnetizing field suppressing layer 101*b* and the upper soft magnetic material layer 101*c* may be continuously deposited in this order instead of depositing the soft magnetic material layer 101. Similar to the first exemplary embodiment, the deposition is performed by use of the magnetron sputtering device 300. The other processes are similar to the above, and therefore, description thereof will be omitted.

With this, the uniaxial magnetic anisotropy is provided in depositing the lower soft magnetic material layer 101*a* and the upper soft magnetic material layer 101*c*. For this reason, it is unnecessary to perform the process of providing the uniaxial magnetic anisotropy by magnetic field annealing. Therefore, in manufacturing of the magnetic sensors 3, the need for the process of magnetic field annealing treatment for providing the uniaxial magnetic anisotropy is eliminated, and thereby the processes required for manufacturing are simplified.

In addition, similar to the second exemplary embodiment, the connection conductive part 31 and the terminal conductive part 32 may be provided.

Fourth Exemplary Embodiment

Configuration of Magnetic Sensor 4

The magnetic sensors 1, 2 and 3 to which the first to third exemplary embodiments are applied receive application of the bias magnetic field from the outside.

A magnetic sensor 4 to which the fourth exemplary embodiment is applied includes a thin film magnet (a thin film magnet 40 in FIGS. 9A and 9B to be described later) configured with a hard magnetic material applying the bias magnetic field. Here, the hard magnetic material has a large, so-called coercive force, the hard magnetic material being once magnetized by an external magnetic field, even upon removal of the external magnetic field, maintaining the magnetized state.

Figure 9A:
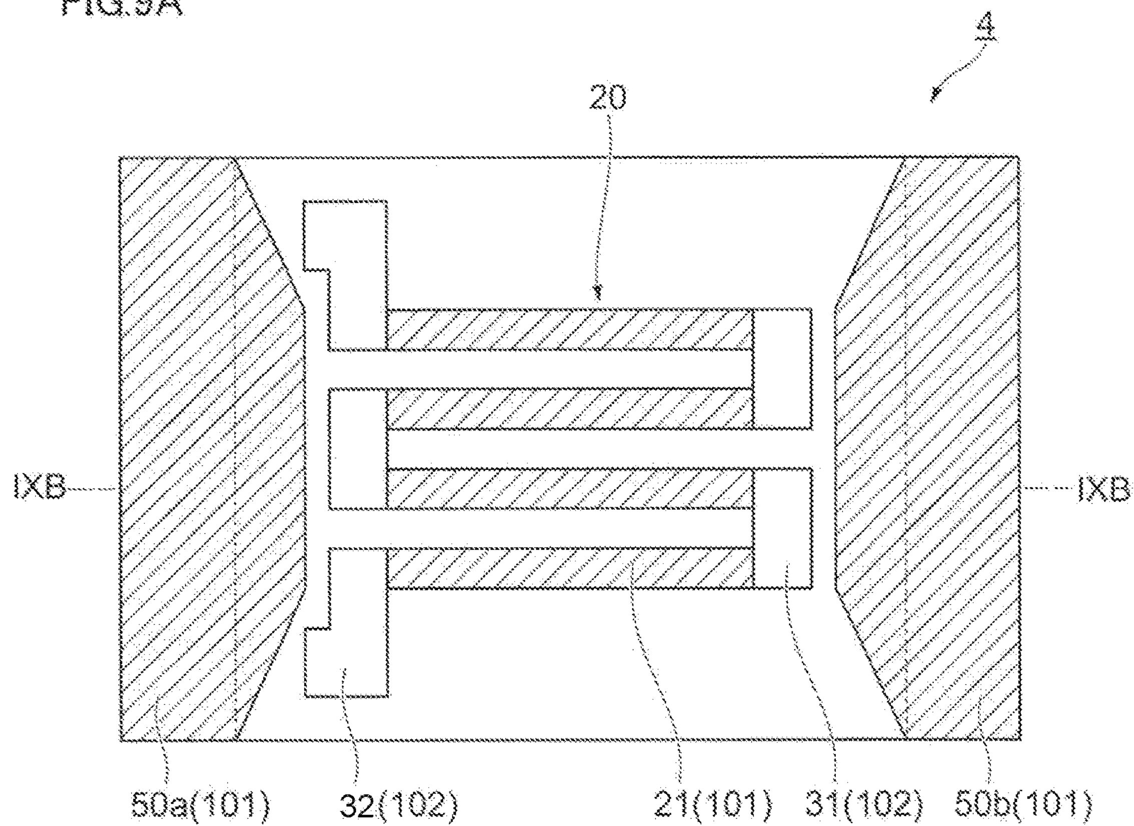
FIGS. 9A and 9B show diagrams illustrating an example of a magnetic sensor to which a fourth exemplary embodiment is applied, where
Figure 9B:
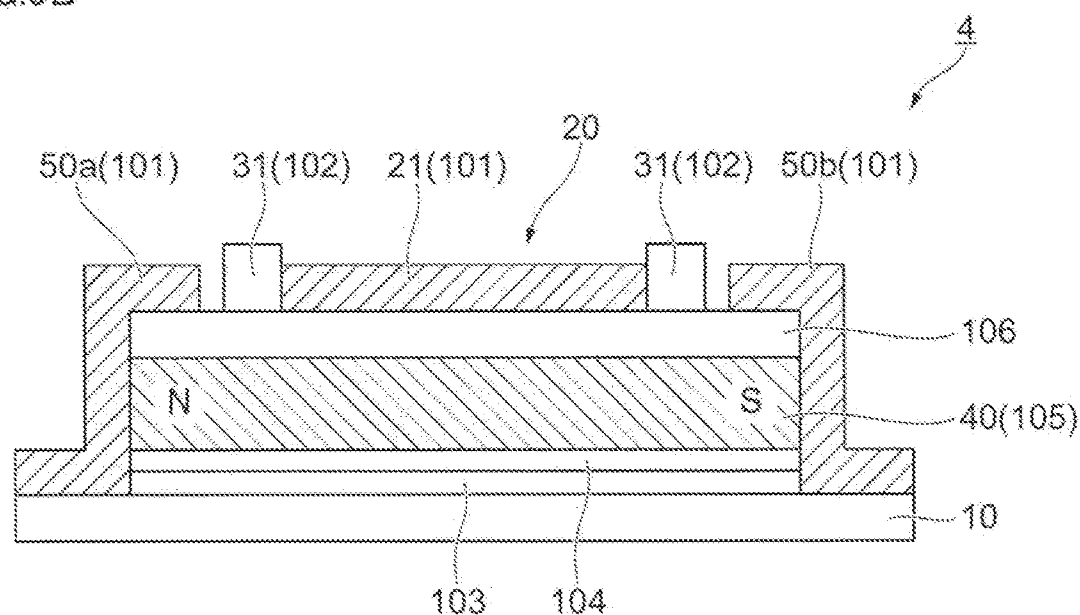

FIGS. 9A and 9B show diagrams illustrating an example of the magnetic sensor 4 to which the fourth exemplary embodiment is applied.

FIG. 9A is a plan view and FIG. 9B is a cross-sectional view along the IXB-IXB line in FIG. 9A.

As shown in FIG. 9B, the magnetic sensor 4 to which the fourth exemplary embodiment is applied includes: a thin film magnet 40 configured with a hard magnetic material (a hard magnetic material layer 105); and a magnetic sensor main body 20 that is provided to face the thin film magnet 40 and is configured with a soft magnetic material (the soft magnetic material layer 101) to sense a magnetic field (an external magnetic field). As described in the magnetic sensor 2 to which the second exemplary embodiment is applied, the magnetic sensor main body 20 includes the sensitive parts 21, the connection conductive parts 31 and the terminal conductive parts 32. Note that the magnetic sensor main body 20 may be similar to the magnetic sensor 1 to which the first exemplary embodiment is applied.

Further, the magnetic sensor 4 includes a control layer 104 controlling so that the magnetic anisotropy of the thin film magnet 40 expresses in the in-plane direction. The control layer 104 is provided on a side of the thin film magnet 40, which is opposite to the side on which the sensitive parts 21 are provided.

The magnetic sensor main body 20 is similar to the magnetic sensor 2 to which the second exemplary embodiment is applied; therefore, description will be omitted.

As shown FIG. 9B, the magnetic sensor 4 includes: a yoke 50*a* that guides the magnetic flux from the north pole of the thin film magnet 40 to an end portion in the longer side of the sensitive part 21 and a yoke 50*b* that guides the magnetic flux from the other end portion in the longer side of the sensitive part 21 to the south pole of the thin film magnet 40, to thereby cause the magnetic flux generated from the north pole and the south pole of the thin film magnet 40 to path through the sensitive part 21 in the longer side. The yokes 50*a* and 50*b* (when they are not distinguished, collectively referred to as a yoke 50) are configured with a soft magnetic material through which the magnetic flux can pass with ease. Here, the yoke 50 is configured with the soft magnetic material layer 101 that constitutes the sensitive part 21. In this manner, the thin film magnet 40 applies a bias magnetic field to the sensitive part 21.

Next, with reference to FIG. 9B, the cross-sectional structure of the magnetic sensor 4 will be described in detail. The magnetic sensor 4 is configured by disposing (laminating) an adhesive layer 103, the control layer 104, the thin film magnet 40 (the hard magnetic material layer 105), an insulating layer 106 and the magnetic sensor main body 20 in this order on a nonmagnetic substrate 10. In each of the adhesive layer 103, the control layer 104, the thin film magnet 40 (the hard magnetic material layer 105) and the insulating layer 106, at least two facing side surfaces are processed to be exposed. Note that the at least two side surfaces to be exposed are set so that two side surfaces of the hard magnetic material layer 105 constituting the exposed thin film magnet 40 serve as the north pole and the south pole. Then, the yokes 50*a* and 50*b* are provided to contact the north pole and the south pole of the exposed thin film magnet 40, respectively, to thereby guide the generated magnetic flux to pass through the sensitive parts 21 in the longer side. Note that the yokes 50*a* and 50*b* may not be provided to contact the north pole and the south pole of the exposed thin film magnet 40, and there may be gaps. Incidentally, when the yokes 50*a* and 50*b* contact the north pole and the south pole of the exposed thin film magnet 40, leakage of the magnetic flux can be suppressed.

Note that, as shown in FIG. 9A, the yoke 50 (the yokes 50*a* and 50*b*) is configured so that the shape thereof as viewed from above the substrate 10 is narrowed as approaching the sensitive part 21. This is to concentrate the magnetic flux generated by the thin film magnet 40 onto the sensitive part 21 (to increase the magnetic flux density). In other words, the width of the north pole and the south pole of the thin film magnet 40 is made wider than the width of the portion where the plural sensitive parts 21 are provided, to thereby increase the bias magnetic field to the sensitive parts 21. Consequently, the width of the portion of the yoke 50 (the yokes 50*a* and 50*b*) facing the sensitive parts 21 may be set wider than the width of the portion where the plural sensitive parts 21 are provided. Note that the width of the portion of the yoke 50 (the yokes 50*a* and 50*b*) facing the sensitive parts 21 may not be narrowed.

Here, the interval between the yoke 50 (the yokes 50*a* and 50*b*) and the end portion in the longer side of the sensitive parts 21 may be, for example, 1 μm to 100 μm.

The adhesive layer 103 improves adhesiveness of the control layer 104 to the substrate 10. As the adhesive layer 103, it is preferable to use an alloy containing Cr or Ni. Examples of the alloy containing Cr or Ni include CrTi, CrTa and NiTa. The thickness of the adhesive layer 103 is, for example, 5 nm to 50 nm. Note that, if there is no problem in adhesiveness of the control layer 104 to the substrate 10, it is unnecessary to provide the adhesive layer 103.

The control layer 104 controls the magnetic anisotropy of the thin film magnet 40 configured with the hard magnetic material layer 105 to express in the in-plane direction of the film. As the control layer 104, it is preferable to use Cr, Mo or W, or an alloy containing thereof (hereinafter, referred to as an alloy containing Cr or the like to constitute the control layer 104). Examples of the alloy containing Cr or the like to constitute the control layer 104 include CrTi, CrMo, CrV and CrW. The thickness of the control layer 104 is, for example, 5 nm to 100 nm.

It is preferable that the hard magnetic material constituting the thin film magnet 40 (the hard magnetic material layer 105) uses an alloy that contains Co as a main component and also contains at least one of Cr and Pt (hereinafter, referred to as a Co alloy constituting the thin film magnet 40). Examples of the Co alloy constituting the thin film magnet 40 include CoCrPt, CoCrTa, CoNiCr and CoCrPtB. Note that Fe may be contained. The thickness of the hard magnetic material constituting the thin film magnet 40 (the hard magnetic material layer 105) is, for example, 50 nm to 500 nm.

The alloy containing Cr or the like to constitute the control layer 104 has a bcc (body-centered cubic) structure. Consequently, the hard magnetic material constituting the thin film magnet 40 (the hard magnetic material layer 105) preferably has an hcp (hexagonal close-packed) structure easily causing crystal growth on the control layer 104 composed of the alloy containing Cr or the like having the bcc structure. When crystal growth of the hard magnetic material layer 105 having the hcp structure is caused on the bcc structure, the c-axis of the hcp structure is likely to be oriented in a plane. Therefore, the thin film magnet 40 configured with the hard magnetic material layer 105 is likely to have the magnetic anisotropy in the in-plane direction. Note that the hard magnetic material layer 105 is polycrystalline, and each crystal has the magnetic anisotropy in the in-plane direction. Consequently, the magnetic anisotropy is referred to as crystal magnetic anisotropy in some cases.

Note that, to promote the crystal growth of the alloy containing Cr or the like to constitute the control layer 104 and the Co alloy constituting the thin film magnet 40, it is preferable that the substrate 10 is heated to 100° C. to 600° C. By the heating, the crystal growth of the alloy containing Cr or the like constituting the control layer 104 is caused, and thereby crystalline orientation is likely to be provided so that the hard magnetic material layer 105 having the hcp structure includes an axis of easy magnetization in a plane. In other words, the magnetic anisotropy is likely to be imparted in a plane of the hard magnetic material layer 105.

The insulating layer 106 is configured with a nonmagnetic insulating material and electrically insulates the thin film magnet 40 and the magnetic sensor main body 20. Examples of the insulating material constituting the insulating layer 106 include oxide, such as $SiO_2$ or $Al_2O_3$, or nitride, such as $Si_2N_4$ or AlN. The thickness of the insulating layer 106 is, for example, 100 nm to 500 nm.

It is preferable that the yoke 50 (the yokes 50*a* and 50*b*) is composed of a soft magnetic material having high magnetic permeability. Here, the yoke 50 is configured with the soft magnetic material layer 101 that constitutes the sensitive parts 21 of the magnetic sensor main body 20.

By providing the yoke 50, the magnetic flux generated from the thin film magnet 40 acts on the sensitive parts 21 as the bias magnetic field via the yoke 50. The yoke 50 reduces the leakage of the magnetic flux from the thin film magnet 40, and thereby the bias magnetic field is effectively applied to the sensitive parts 21. Owing to the thin film magnet 40, it is unnecessary to apply the bias magnetic field from the outside by a coil or the like. Consequently, it is possible to perform power saving and downsizing of the magnetic sensor 4.

Note that, similar to the sensitive parts 21, the thin film magnet 40 may be plural thin film magnet pieces that are provided to correspond to the respective sensitive parts 21. In other words, there may be a configuration in which the sensitive parts 21 are laminated on the thin film magnet pieces via the insulating layer 106. With this, a demagnetizing field generated inside the thin film magnet 40 is reduced, and thereby the magnetic flux generation efficiency from the thin film magnet 40 is increased.

Method of Manufacturing Magnetic Sensor 4

Next, an example of a method of manufacturing the magnetic sensor 4 will be described.

FIGS. 10A to 10G show diagrams illustrating an example of the manufacturing method of the magnetic sensor 4 to which the fourth exemplary embodiment is applied. FIGS. 10A to 10G show respective processes in the method of manufacturing the magnetic sensor 4. Note that FIGS. 10A to 10G show the representative processes, and the processes proceed in the order of FIGS. 10A to 10G. FIGS. 10A to 10G correspond to the cross-sectional view in FIG. 9B.

The substrate 10 is, as described above, composed of a non-magnetic material; examples include an oxide substrate, such as glass or sapphire, or a semiconductor substrate, such as silicon. On the substrate 10, for example, streaky grooves or streaky asperities with the radius of curvature Ra of 0.1 nm to 100 nm may be provided by use of a polisher or the like. Note that it is preferable to provide the streaks of the streaky grooves or the streaky asperities in a direction connecting the north pole and the south pole of the thin film magnet 40 configured with the hard magnetic material layer 105. Consequently, in the case where the magnetic sensor 4 is disposed as the magnetic sensor 1 shown in FIGS. 4A and 4B or FIGS. 6A and 6B, it is preferable to concentrically form streaky grooves or streaky asperities.

With this, the crystal growth in the hard magnetic material layer 105 is promoted in the direction of the grooves. Consequently, the axis of easy magnetization of the thin film magnet 40 configured with the hard magnetic material layer 105 is more likely to face the groove direction (the direction connecting the north pole and the south pole of the thin film magnet 40). In other words, magnetization of the thin film magnet 40 becomes easier.

In the manufacturing method to be described as follows, a lift-off method is mainly used. Note that an etching method may also be used.

First, the substrate 10 is cleaned, and thereafter, as shown in FIG. 10A, on the surface of the substrate 10, a resist pattern 202 including an opening for a portion where the thin film magnet 40 is formed is formed by a known photolithography. Here, the direction of the magnetic sensor 4 is set so that the direction of the magnetic field of the magnetron sputtering device 300 (refer to FIG. 3) used in FIG. 10E is aligned with the shorter side of the sensitive part 21 of the magnetic sensor main body 20.

Next, as shown in FIG. 10B, on the surface of the substrate 10 where the resist pattern 202 has been formed, the adhesive layer 103, the control layer 104 and the hard magnetic material layer 105 constituting the thin film magnet 40 are deposited in order. For example, by use of a sputtering method, a layer (a film) of an alloy containing Cr or Ni to constitute the adhesive layer 103, a layer (a film) of an alloy containing Cr or the like to constitute the control layer 104 and a layer (a film) of a Co alloy to constitute the hard magnetic material layer 105 are successively deposited in order. As described above, in forming the control layer 104 and the hard magnetic material layer 105, it is preferable to heat the substrate 10 to, for example, 100° C. to 600° C. for accelerating the crystal growth.

Note that, in deposition of the adhesive layer 103, the substrate 10 may be heated or may not be heated. To remove the moisture and so forth absorbed onto the substrate 10, the substrate 10 may be heated before the adhesive layer 103 is deposited.

Next, a layer (a film) of oxide, such as $SiO_2$ or $Al_2O_3$, or nitride, such as $Si_2N_4$ or AlN to constitute the insulating layer 106 is deposited. Deposition of the insulating layer 106 can be performed by plasma CVD, a reactive sputtering method, or the like.

Then, as shown in FIG. 10C, the resist pattern 202 is removed, and the portions of the adhesive layer 103, the control layer 104, the hard magnetic material layer 105 and the insulating layer 106 deposited on the resist pattern 202 are also removed (lift-off). In this manner, the adhesive layer 103, the control layer 104, the hard magnetic material layer 105 and the insulating layer 106 are formed on the substrate 10. The hard magnetic material layer 105 serves as the thin film magnet 40.

Next, as shown in FIG. 10D, a resist pattern 203, which has openings serving as the portions where the sensitive parts 21 in the magnetic sensor main body 20 and the yokes 50 (the yoke 50*a* and 50*b*) are formed, is formed on the substrate 10.

Then, as shown in FIG. 10E, on the substrate 10 where the resist pattern 203 has been formed, a film of the Co alloy, which serves as the soft magnetic material layer 101 to constitute the sensitive parts 21 and the yoke 50, is deposited. Here, the magnetron sputtering device 300 shown in FIG. 3 is used.

As shown in FIG. 10F, by removing the resist pattern 203, the portions of the soft magnetic material layer 101 deposited on the resist pattern 203 are also removed. The soft magnetic material layer 101 laminated on the thin film magnet 40 (the hard magnetic material layer 105) via the insulating layer 106 serves as the sensitive parts 21 of the magnetic sensor main body 20. Then, the soft magnetic material layer 101, a part of which is in contact with the north pole or the south pole of the thin film magnet 40 and the other part of which extends to face the sensitive parts 21, serves as the yoke 50 (the yokes 50*a* and 50*b*). In other words, the sensitive parts 21 of the magnetic sensor main body 20 and the yoke 50 are formed by a single deposition of the soft magnetic material layer 101.

Next, as shown in FIG. 10G, the connection conductive parts 31 and the terminal conductive parts 32 that windingly connect the sensitive parts 21 are formed by the conductor layer 102.

Thereafter, the hard magnetic material layer 105 constituting the thin film magnet 40 is magnetized. For magnetizing the hard magnetic material layer 105, in the static magnetic field or in a pulsed magnetic field, a magnetic field larger than a coercive force of the hard magnetic material layer 105 is applied until magnetization of the hard magnetic material layer 105 becomes saturated. Thus, the magnetized hard magnetic material layer 105 serves as the thin film magnet 40, and the magnetic flux from the thin film magnet 40 supplies the bias magnetic field to the sensitive parts 21 of the magnetic sensor main body 20 via the yoke 50.

In this manner, the magnetic sensor 4 is manufactured.

Note that, in the case where the control layer 104 is not provided, it becomes necessary to impart the magnetic anisotropy in a plane by causing the crystal growth by heating the hard magnetic material layer 105 to not less than 800° C. after the hard magnetic material layer 105 was deposited. However, in the magnetic sensor 4 to which the fourth exemplary embodiment is applied, the crystal growth is accelerated by the control layer 104; therefore, the crystal growth caused by heating to not less than 800° C. is not required.

Further, by use of the magnetron sputtering device 300 for forming (depositing) the soft magnetic material layer 101, the uniaxial magnetic anisotropy is provided at the same time of deposition of the soft magnetic material layer 101, as well as the deposition rate of the soft magnetic material layer 101 is improved to reduce the time required for deposition. Therefore, in manufacturing of the magnetic sensor 4, the need for the process of magnetic field annealing treatment for providing the uniaxial magnetic anisotropy is eliminated, and thereby the processes required for manufacturing are simplified.

Fifth Exemplary Embodiment

In a magnetic sensor 5 to which a fifth exemplary embodiment is applied, similar to the third exemplary embodiment, the sensitive part 21 in the magnetic sensor main body 20 of the magnetic sensor 4 described in the fourth exemplary embodiment is configured with two soft magnetic material layers provided with a demagnetizing field suppressing layer interposed therebetween. Hereinafter, portions different from those of the magnetic sensor 4 to which the fourth exemplary embodiment is applied will be mainly described, and similar portions will be assigned with same reference signs to thereby omit descriptions thereof.

Magnetic Sensor 5

Figure 11A:
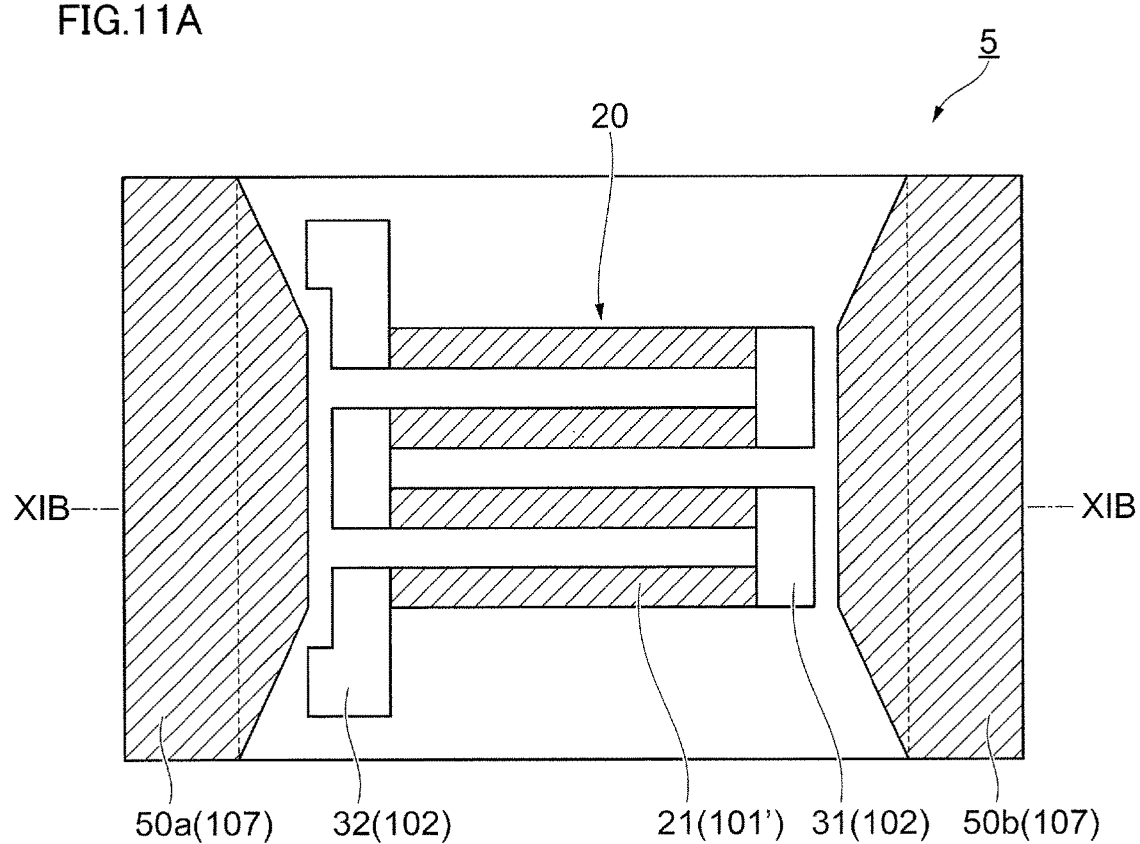
FIGS. 11A and 11B show diagrams illustrating an example of a magnetic sensor to which a fifth exemplary embodiment is applied, where
Figure 11B:
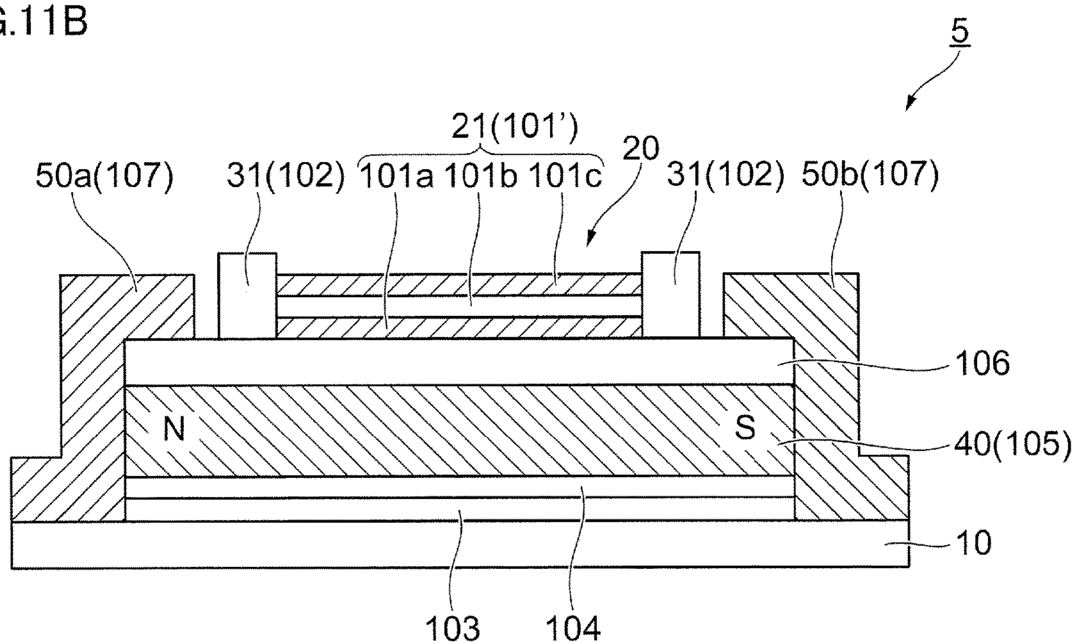

FIGS. 11A and 11B show diagrams illustrating an example of the magnetic sensor 5 to which the fifth exemplary embodiment is applied. FIG. 11A is a plan view and FIG. 11B is a cross-sectional view along the XIB-XIB line in FIG. 11A.

As shown in FIG. 11B, in the magnetic sensor 5, similar to the magnetic sensor 3 shown in FIGS. 8A and 8B, the magnetic material layer 101' constituting the sensitive parts 21 in the magnetic sensor main body 20 includes the lower soft magnetic material layer 101*a*, the demagnetizing field suppressing layer 101*b* and the upper soft magnetic material layer 101*c*.

Note that the yoke 50 (the yokes 50*a* and 50*b*) is configured with a soft magnetic material layer 107.

The magnetic sensor 5 is manufactured by changing the manufacturing method of the magnetic sensor 4 shown in FIGS. 10A to 10G. In other words, in FIG. 10E, the magnetic material layer 101' configured with the lower soft magnetic material layer 101*a*, the demagnetizing field suppressing layer 101*b* and the upper soft magnetic material layer 101*c* is deposited instead of the soft magnetic material layer 101. Note that, at this time, the resist pattern 203 has openings of only the sensitive parts 21.

Then, after FIG. 10F, a resist pattern including the openings for the yoke 50 (the yokes 50*a* and 50*b*) is formed and the soft magnetic material layer 107 is deposited. The yoke 50 (the yokes 50*a* and 50*b*) may be formed by removing (lifting off) the soft magnetic material layer 107 on the resist pattern as well as the resist pattern.

Sixth Exemplary Embodiment

In a magnetic sensor 6 to which a sixth exemplary embodiment is applied, similar to the magnetic sensor 5 of the fifth exemplary embodiment, the sensitive part 21 in the magnetic sensor main body 20 is configured with the two soft magnetic material layers provided with the demagnetizing field suppressing layer interposed therebetween. Further, the yoke 50 is also configured with the two soft magnetic material layers provided with the demagnetizing field suppressing layer interposed therebetween. Hereinafter, portions different from those of the magnetic sensor 5 of the fifth exemplary embodiment will be mainly described, and similar portions will be assigned with same reference signs to thereby omit descriptions thereof.

Magnetic Sensor 6

Figure 12A:
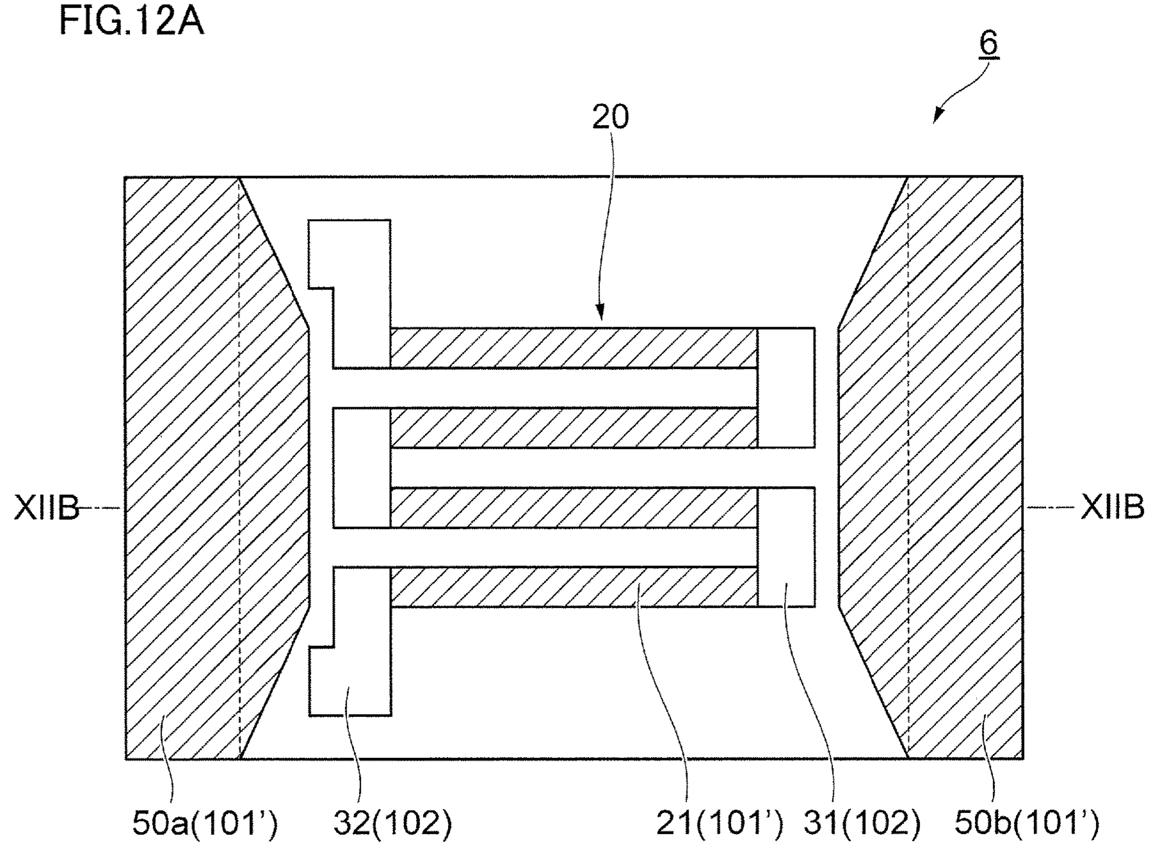
FIGS. 12A and 12B show diagrams illustrating an example of a magnetic sensor to which a sixth exemplary embodiment is applied, where
Figure 12B:
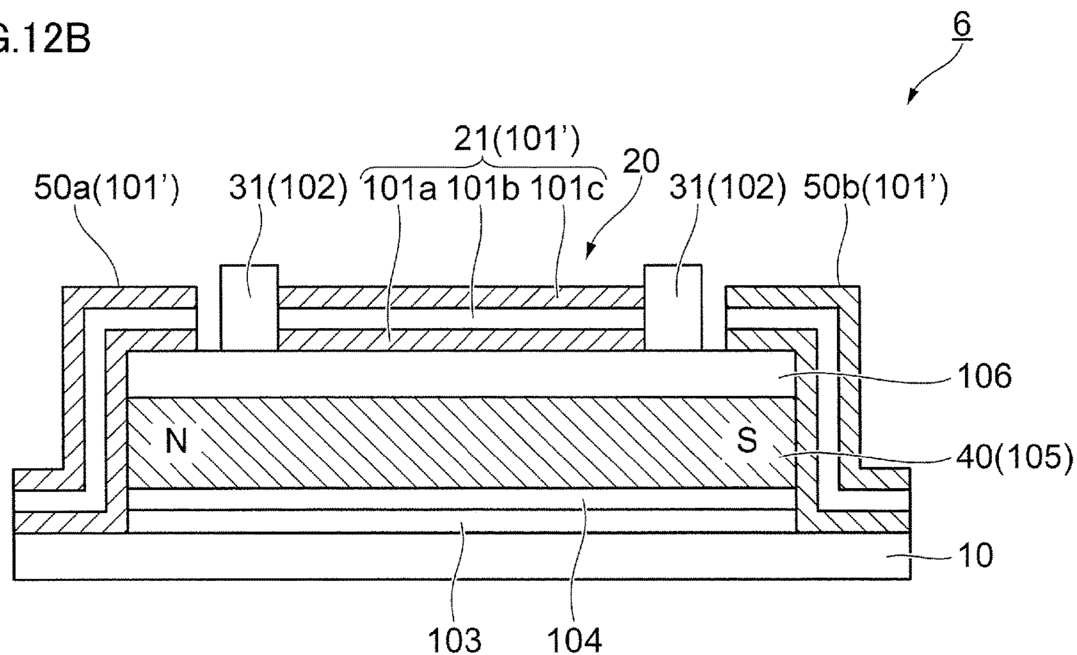

FIGS. 12A and 12B show diagrams illustrating an example of the magnetic sensor 6 to which the sixth exemplary embodiment is applied. FIG. 12A is a plan view and FIG. 12B is a cross-sectional view along the XIIB-XIIB line in FIG. 12A.

In the magnetic sensor 6 to which the sixth exemplary embodiment is applied, the yoke 50 (the yokes 50*a* and 50*b*) is different.

As shown in FIG. 12B, in the magnetic sensor 6, the yoke 50 (the yokes 50*a* and 50*b*) is configured with the magnetic material layer 101', which is the same as the sensitive part 21 of the magnetic sensor main body 20 of the magnetic sensor 5 to which the fifth exemplary embodiment is applied. In other words, the yoke 50 (the yokes 50*a* and 50*b*) includes the lower soft magnetic material layer 101*a*, the demagnetizing field suppressing layer 101*b* and the upper soft magnetic material layer 101*c*.

With this, in the method of manufacturing the magnetic sensor 6, the lower soft magnetic material layer 101*a*, the demagnetizing field suppressing layer 101*b* and the upper soft magnetic material layer 101*c* constituting the magnetic material layer 101' may be deposited in order instead of deposition of the soft magnetic material layer 101 shown in FIG. 10E.

So far, the first to sixth exemplary embodiments have been described; however, various modifications may be available without deviating from the gist of the present invention.

REFERENCE SIGNS LIST

1-6 Magnetic sensor
10 Substrate
20 Magnetic sensor main body
21 Sensitive part
22 Connection part
23 Terminal part
31 Connection conductive part
32 Terminal conductive part
40 Thin film magnet
50, 50*a*, 50*b* Yoke
101, 107 Soft magnetic material layer
101' Magnetic material layer
101*a* Lower soft magnetic material layer
101*b* Demagnetizing field suppressing layer
101*c* Upper soft magnetic material layer
102 Conductor layer
103 Adhesive layer
104 Control layer
105 Hard magnetic material layer
106 Insulating layer
201, 202, 203 Resist pattern
300 Magnetron sputtering device
310 Partition wall
320 Magnetron cathode
321 Cathode housing
322 Target
323 Backing plate
330 Magnetic circuit
331, 332 Magnet
333 Yoke
340 Chamber
350 Substrate holder
360 High-frequency power supply

The invention claimed is:

1. A method of manufacturing a magnetic sensor array, the method comprising:

a soft magnetic material layer deposition process depositing a soft magnetic material layer on a substrate by magnetron sputtering, the soft magnetic material layer constituting a sensitive part sensing a magnetic field; and a sensitive part formation process forming the sensitive part sensing the magnetic field in a portion of the soft magnetic material layer where uniaxial magnetic anisotropy is provided by a magnetic field used for the magnetron sputtering, wherein the magnetron sputtering is performed in a plane facing a surface of the substrate by use of a cathode in which a magnetic circuit forming a magnetic field rotates, and wherein the magnetic circuit is arranged concentrically with respect to the substrate and a shorter side of the sensitive part is formed to be parallel to a diameter direction of the substrate, and wherein the magnetic sensor array comprises a plurality of magnetic sensors, each including a sensitive part sensing a magnetic field, arranged concentrically with respect to the substrate.

2. The method of manufacturing a magnetic sensor array according to claim 1, wherein, in the sensitive part formation process, the sensitive part having a longer side and a shorter side is formed to be placed such that the shorter side direction is in a direction of the uniaxial magnetic anisotropy.

3. The method of manufacturing a magnetic sensor array according to claim 1, wherein the soft magnetic material layer deposition process and the sensitive part formation process are performed on a substrate provided with a thin film magnet configured with a hard magnetic material forming a magnetic field in a direction intersecting the direction of the uniaxial magnetic anisotropy of the sensitive part.

4. The method of manufacturing a magnetic sensor array according to claim 2, wherein the soft magnetic material layer deposition process and the sensitive part formation process are performed on a substrate provided with a thin film magnet configured with a hard magnetic material forming a magnetic field in a direction intersecting the direction of the uniaxial magnetic anisotropy of the sensitive part.

* * * * *